(12) United States Patent
Lim et al.

(10) Patent No.: US 12,283,978 B2
(45) Date of Patent: Apr. 22, 2025

(54) SUPPORT PLATE AND PORTABLE COMMUNICATION DEVICE INCLUDING THE SAME

(71) Applicant: Samsung Electronics Co., Ltd., Gyeonggi-do (KR)

(72) Inventors: Hyosang Lim, Gyeonggi-do (KR); Heekwang Lim, Gyeonggi-do (KR); Sangsik Na, Gyeonggi-do (KR); Hyeonseok Yoon, Gyeonggi-do (KR); Changsu Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 150 days.

(21) Appl. No.: 17/548,036

(22) Filed: Dec. 10, 2021

(65) Prior Publication Data

US 2022/0247434 A1 Aug. 4, 2022

Related U.S. Application Data

(63) Continuation of application No. PCT/KR2021/017244, filed on Nov. 23, 2021.

(30) Foreign Application Priority Data

Feb. 1, 2021 (KR) ........................ 10-2021-0014317

(51) Int. Cl.
*H04B 1/03* (2006.01)
*H01Q 1/24* (2006.01)
(Continued)

(52) U.S. Cl.
CPC ............. *H04B 1/034* (2013.01); *H01Q 1/243* (2013.01); *H01Q 1/38* (2013.01); *H05K 5/00* (2013.01)

(58) Field of Classification Search
None
See application file for complete search history.

(56) References Cited

U.S. PATENT DOCUMENTS 7,280,075 B2 10/2007 Koyama et al.
8,364,212 B2 1/2013 Waku et al.
(Continued)

FOREIGN PATENT DOCUMENTS

CN 108882606 11/2018
EP 3 509 279 7/2019
(Continued)

OTHER PUBLICATIONS

International Search Report dated Mar. 15, 2022 issued in counterpart application No. PCT/KR2021/017244, 9 pages.
(Continued)

*Primary Examiner* — Courtney L Smith
(74) *Attorney, Agent, or Firm* — The Farrell Law Firm, P.C.

(57) ABSTRACT

Disclosed is a portable communication device including a housing, a printed circuit board seated in the housing and mounted to a communication circuit, and a least one position adjusting groove, wherein the housing includes a support plate having at least one antenna unit operatively connected with the communication circuit, and an injection molded member surrounding at least a portion of the at least one antenna unit, wherein the support plate includes a main body in which at least a portion of the printed circuit board is seated, and at least one lead connecting the at least one antenna unit with the main body, and wherein the at least one position adjusting groove is formed at a position at which the at least one lead makes contact with the injection molded member.

18 Claims, 11 Drawing Sheets

(51) Int. Cl.
    *H01Q 1/38*     (2006.01)
    *H04B 1/034*     (2006.01)
    *H05K 5/00*     (2006.01)

(56) References Cited

U.S. PATENT DOCUMENTS

| | | | |
|---|---|---|---|
| 8,643,547 B2* | 2/2014 | Hong | H01Q 1/38 |
| | | | 343/702 |
| 9,444,133 B2 | 9/2016 | Hong et al. | |
| 9,578,759 B2 | 2/2017 | Seo et al. | |
| 9,583,821 B2* | 2/2017 | Hill | H01Q 1/243 |
| 10,433,437 B2 | 10/2019 | Baek et al. | |
| 10,588,226 B2 | 3/2020 | Baek et al. | |
| 10,819,010 B2 | 10/2020 | Lee et al. | |
| 11,051,416 B2* | 6/2021 | Baek | G06F 1/1698 |
| 11,744,028 B2 | 8/2023 | Baek et al. | |
| 2006/0192714 A1 | 8/2006 | Koyama | H04M 1/0202 |
| | | | 343/702 |
| 2010/0060529 A1* | 3/2010 | Schlub | H01Q 9/0442 |
| | | | 343/702 |
| 2010/0093411 A1 | 4/2010 | Waku et al. | |
| 2013/0293424 A1* | 11/2013 | Zhu | H01Q 1/44 |
| | | | 343/702 |
| 2014/0111684 A1* | 4/2014 | Corbin | H05K 1/0215 |
| | | | 343/702 |
| 2016/0234949 A1 | 8/2016 | Seo et al. | |
| 2016/0254588 A1* | 9/2016 | Kim | H01Q 1/24 |
| | | | 343/702 |
| 2017/0170562 A1* | 6/2017 | Lee | H01Q 7/00 |
| 2021/0168230 A1* | 6/2021 | Baker | G06F 1/1698 |
| 2021/0312153 A1* | 10/2021 | Su | H05K 5/0217 |
| 2021/0329800 A1 | 10/2021 | Baek et al. | |

FOREIGN PATENT DOCUMENTS

| | | |
|---|---|---|
| JP | 2006-238204 | 9/2006 |
| KR | 10-2010-0011258 | 2/2010 |
| KR | 1020110015908 | 2/2011 |
| KR | 1020160145949 | 12/2016 |
| KR | 1020170071200 | 6/2017 |
| KR | 10-1876813 | 7/2018 |
| KR | 1020180104517 | 9/2018 |
| KR | 1020210069596 | 6/2021 |

OTHER PUBLICATIONS

European Search Report dated Mar. 27, 2024 issued in counterpart application No. 21923393.9-1224, 10 pages.
Indian Examination Report dated Sep. 27, 2024 issued in counterpart application No. 202337044446, 7 pages.
Korean Office Action dated Feb. 24, 2025 issued in counterpart application No. 10-2021-0014317, 17 pages.

* cited by examiner

SUPPORT PLATE AND PORTABLE COMMUNICATION DEVICE INCLUDING THE SAME

CROSS-REFERENCE TO RELATED APPLICATION(S)

This application is a bypass continuation of International Application No. PCT/KR2021/017244, which was filed on Nov. 23, 2021, and is based on and claims priority under 35 U.S.C. § 119 to Korean Patent Application No. 10-2021-0014317, which was filed in the Korean Intellectual Property Office on Feb. 1, 2021, the entire disclosure of each of which is incorporated herein by reference.

BACKGROUND

1. Field

The disclosure relates generally to a communication device, and more particularly, to a support plate of a portable communication device.

2. Description of Related Art

A portable communication device, such as a smartphone, may provide various functions, such as conversations, moving picture reproduction, and the searching for the Internet, based on various types of applications. The portable communication device may be embedded with various components such as a printed circuit board (PCB) and a battery in which a plurality of electronic elements are integrated. To protect the components from an external environment, a support plate having specified stiffness is applicable. The support plate may at least partially include a metal material, and one side of the support plate may be provided, through an injection molding process, with the structure to seat various components.

In the injection molding process, a pressure is applied while an injection material is injected into a mold. When the pressure is applied to one side of the support plate, at least a portion of the support plate tends to be bent in shape or broken.

As such, there is a need in the art for a method and apparatus that eliminates such deformation or breaking of the support plate.

SUMMARY

The disclosure has been made to address at least the above-mentioned problems and/or disadvantages and to provide at least the advantages described below.

Accordingly, an aspect of the disclosure is to provide a support plate and a portable communication device including the same, in which a groove is provided in one side of the support plate such that the support plate is prevented from being deformed or broken in an injection molding process.

Another an aspect of the disclosure is to provide a support plate and a portable communication device including the same, in which and a protrusion is provided to a mold to prevent the support plate from being shaken, through the groove, thereby preventing the support plate from being deformed or broken.

According to an aspect of the disclosure, a portable communication device includes a housing, a printed circuit board seated in the housing and mounted to a communication circuit, and a least one position adjusting groove, wherein the housing includes a support plate having at least one antenna unit operatively connected with the communication circuit, and an injection molded member surrounding at least a portion of the at least one antenna unit, wherein the support plate includes a main body in which at least a portion of the printed circuit board is seated, and at least one lead connecting the at least one antenna unit with the main body, and wherein the at least one position adjusting groove is formed at a position at which the at least one lead makes contact with the injection molded member.

BRIEF DESCRIPTION OF THE DRAWINGS

The above and other aspects, features, and advantages of the disclosure will be more apparent from the following detailed description taken in conjunction with the accompanying drawings, in which.

DETAILED DESCRIPTION

Figure 1:
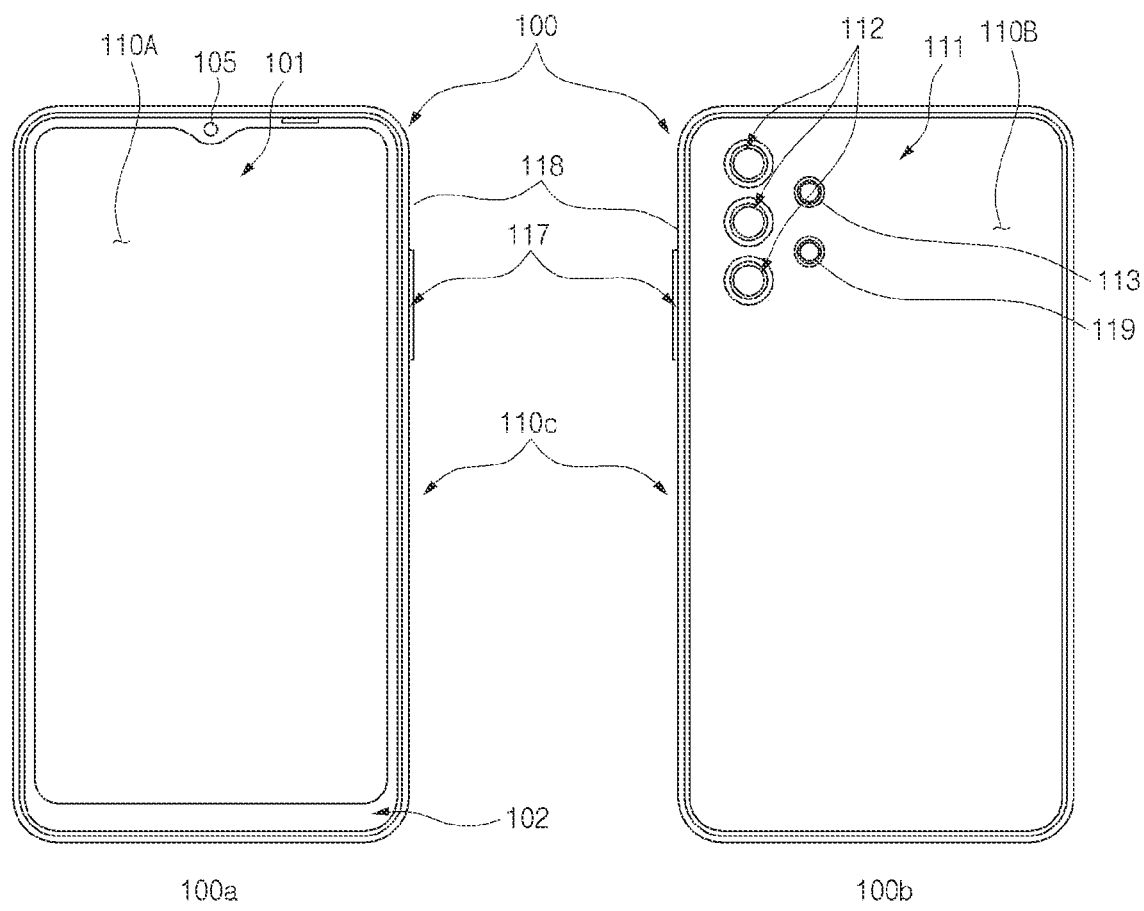
FIG. 1 illustrates a portable communication device, according to an embodiment.

Hereinafter, embodiments of the disclosure will be described with reference to accompanying drawings. However, those of ordinary skill in the art should understand that the disclosure is not limited to a specific embodiment, and modifications, equivalents, and/or alternatives on the various embodiments described herein may be variously made without departing from the scope and spirit of the disclosure. In the drawings, similar components may be assigned with similar reference numerals. Descriptions of well-known functions and constructions will be omitted for the sake of clarity and conciseness.

In the disclosure, it will be further understood that terms such as "have", "can have," "includes" and/or "can include", when used herein, specify the presence of components such as a numeric value, a function, an operation, or a part, but do not preclude the presence or addition of one or more other features.

In the disclosure, the expressions "A or B", "at least one of A and/or B", "one or more of A and/or B" may include all possible combinations of one or more of the associated listed items. For example, "A or B", "at least one of A and B", or "at least one of A or B" includes at least one A, at least one B, or at least one "A" and at least one "B".

Terms such as "first" and "second" used herein may refer to various components regardless of the order and/or priority of the components and may be used to distinguish a component from another component, not to limit the elements. For example, a first user device and a second user device may merely represent mutually different user devices, regardless of the order and/or priority of the first user device and the second user device. A first component discussed below may be referred to as a second component without departing from the technical scope of the disclosure. Similarly, the second component may be referred to as the first component.

It will be understood that when a first component is referred to as being operatively or communicatively coupled with/to or connected to a second component, the first component may be directly coupled with/to or connected to the second component or an intervening third component may be present therebetween. Meanwhile, it will be understood that when the first component is referred to as being directly coupled with/to or connected to the second component, a third component may be absent between the first and second components.

For example, the expression "configured to" used herein may be interchangeably used with "suitable for", "having the capacity to", "designed to", "adapted to", "made to", or" or "capable of" depending on occasions. The expression "configured to" does not refer to essentially "specifically designed to" in hardware. Under a certain situation, the expression "a device configured to" may indicate that the device is "capable of" operating together with another device or other components. For example, a "processor configured to (or adapted to) perform A, B, and C" may indicate a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

The terms herein are used only for specific embodiments, and the scope of another embodiment is not limited thereto. The terms of a singular form may include plural forms unless otherwise specified. In addition, unless otherwise defined, all terms used herein, including technical or scientific terms, have the same meanings as those generally understood by those skilled in the art to which the disclosure pertains. Such terms, which are used herein, as those defined in a generally used dictionary are to be interpreted as having the same meanings as the contextual meanings in the relevant field of art and are not to be interpreted as having ideal or excessively formal meanings unless clearly defined as having such in the present disclosure. Even if the terms are defined in the disclosure, the terms should not be interpreted as excluding embodiments of the disclosure if necessary.

Herein, an electronic device may include at least one of a smartphone, a tablet personal computer (PC), a mobile phone, a video phone, and an e-book reader, a desktop PC, laptop PC, a netbook computer, a workstation, a server, a personal digital assistant (PDA), a portable multimedia player (PMP), a motion pictures experts group layer audio 3 (MP3) player, a mobile medical device, a camera, a home appliance, or a wearable device such as an accessory type-device (e.g., a timepiece, a ring, a bracelet, an anklet, a necklace, glasses, a contact lens, or a head-mounted device (HMD)), one-piece fabric or clothes-type device (e.g., electronic clothes), a body-attached-type device (e.g., a skin pad or a tattoo), or a bio-implantable circuit. However, the electronic devices are not limited to those devices.

With regard to the description of the drawings, similar reference numerals may be used to refer to similar or related elements. It is to be understood that a singular form of a noun corresponding to an item may include one or more of the things, unless the relevant context clearly indicates otherwise.

The term "user" used herein may refer to a person who uses the electronic device or may refer to an artificial intelligence electronic device that uses the electronic device.

FIG. 1 illustrates a portable communication device, according to various embodiments. For example, reference sign 100a of FIG. 1 illustrates a front surface of a portable communication device 100, and reference sign 100b of FIG. 1 illustrates a rear surface of a portable communication device 100.

Referring to FIG. 1, the portable communication device 100 may include a housing including a first surface 110A (or front surface), a second surface 110B (or rear surface), and a side surface 110C surrounding the space between the first surface 110A and the second surface 110B. Alternatively, the housing may be referred to as the structure including some of the first surface 110A, the second surface 110B, and the side surface 110C of FIG. 1.

The first surface 110A may include a front plate 102 (e.g., a glass plate or a polymer plate including various coating layers) that is substantially transparent in at least a portion thereof. The second surface 110B may include a rear plate 111 that is substantially opaque. The rear plate 111 may include coating or colored glass, ceramic, polymer, metal (e.g., aluminum, stainless steel (STS), or magnesium) or the combination of that least two of the above materials. The side surface 110C may include a side bezel structure (or side member) 118 which is coupled to the front plate 102 and the rear plate 111, and includes metal and/or polymer). The rear plate 111 and the side bezel structure 118 may be formed integrally with each other and may include the same material (e.g., a metal material such as aluminum).

The portable communication device 100 may include at least one of a display 101, sensor modules 113 and 119, camera modules 105 and 112, or a key input device 117. The portable communication device 100 may omit at least one of these components or may additionally include another component. The portable communication device 100 may further include an audio module and a connector hole.

The display 101 may be exposed through a substantial portion of the front plate 102. At least a portion of the display 101 may be exposed through the front plate 102 constituting the first surface 110A. The edge of the display 101 may be formed substantially identically to the shape of an adjacent outer shape of the front plate 102. To expand an area for exposing the display 101, the distance between an outer portion of the display 101 and an outer portion of the front plate 102 may be substantially uniformly formed.

A recess or an opening is formed in a portion of a screen display area of the display 101. In addition, at least one of an audio module, a sensor module, or a camera module 105 aligned with the recess or the opening may be included in the portion of the screen display area of the display 101. At least one of the audio module, the sensor module, the camera module 105, or a fingerprint sensor may be included in a rear surface of the screen display area of the display 101. The display 101 may be coupled or disposed adjacent to a touch sensing circuit, a pressure sensor to measure the intensity (pressure) of a touch, and/or a digitizer to detect the stylus pen based on an electromagnetic scheme. At least a portion of the sensor modules 113 and 119 and/or at least a portion of the key input device 117 may be disposed in some areas of the first surface 110A having the display 101.

The sensor modules 113 and 119 may generate an electrical signal or a data value corresponding to an internal operating state or an external environment state of the portable communication device 100. The sensor modules 113 and 119 may include a first sensor module, such as a proximity sensor, and/or a second sensor module, such as a fingerprint sensor, disposed on the first surface 110A of the housing, and/or third and fourth sensor modules 113 and 119, such as a heart rate monitor (HRM) sensor and a fingerprint sensor, disposed on the second surface 110B of the housing. The fingerprint sensor may be disposed on the second surface 110B as well as the first surface 110A of the housing. The portable communication device 100 may further include at least one of a gesture sensor, a gyro sensor, an air pressure sensor, a magnetic sensor, an acceleration sensor, a grip sensor, a color sensor, an infrared sensor, a biometric sensor, a temperature sensor, a humidity sensor, or an illuminance sensor.

The camera modules 105 and 112 may include a first camera device 105 disposed on the first surface 110A of the portable communication device 100 and a second camera device 112 disposed on the second surface 110B of the portable communication device 100. The camera devices 105 and 112 may include one or more lenses, an image sensor, and/or an image signal processor. Two or more lenses (infrared camera, a wide angle lens, and a telephoto lens) and image sensors may be disposed on one side surface of the portable communication device 100.

The key input device 117 may be disposed on the side surface 110C of the housing 110. Alternatively, the portable communication device 100 may not include some or an entire portion of the key input device 117, which some or entire portion may be implemented in another form such as a soft key on the display 101. Alternatively, the key input device 117 may include the sensor module disposed on the second surface 110B of the housing 110.

Figure 2:
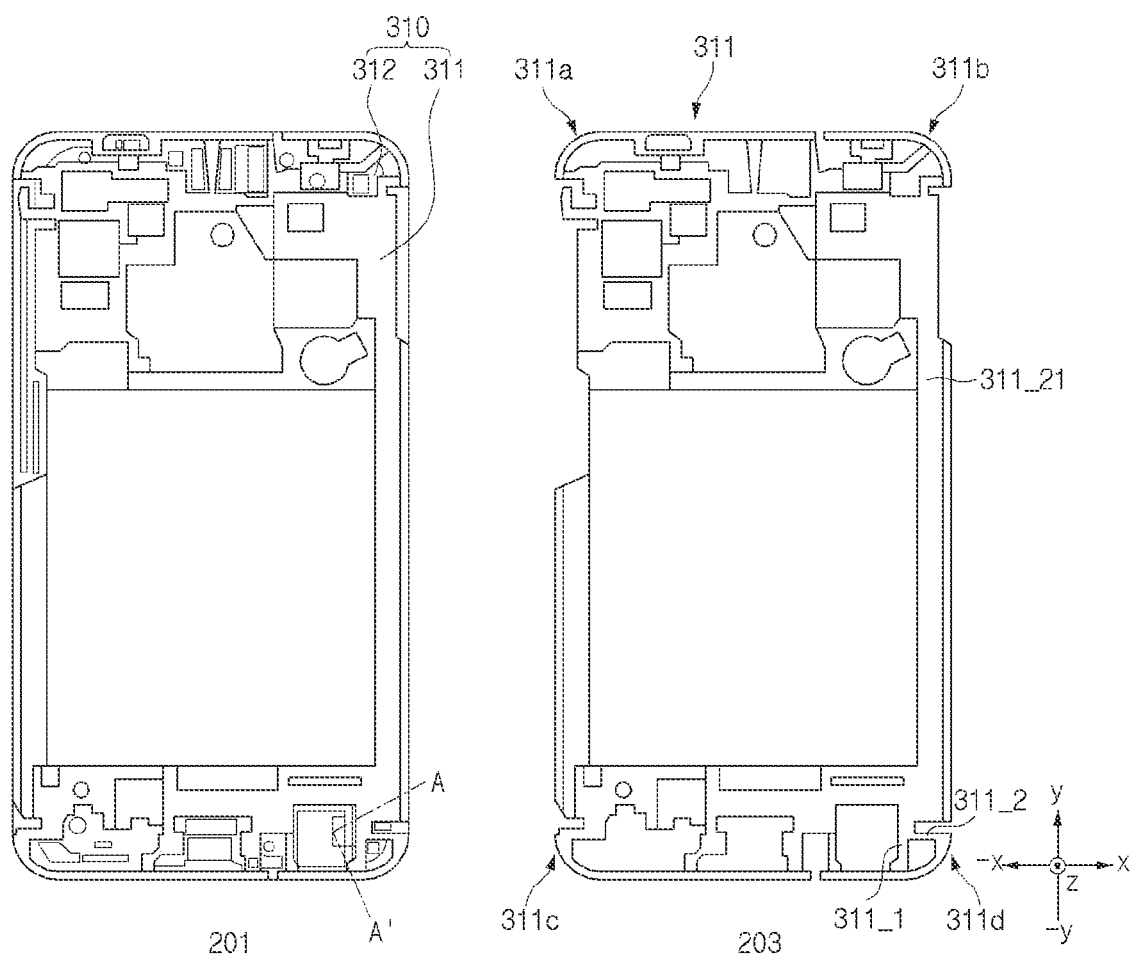
FIG. 2 illustrates a support plate and a housing of a portable communication device, according to an embodiment.

FIG. 2 illustrates a support plate and a housing of a portable communication device, according to an embodiment of the disclosure. State 201 of FIG. 2 illustrates the housing of the portable communication device, and state 203 of FIG. 2 illustrates the support plate of the portable communication device. In this case, the housing 310 may correspond to a component of the housing including the first surface 110A, the second surface 110B, and the side surface 110C, which have been described with reference to FIG. 1.

Referring to FIG. 2, in state 201, the housing 310 may include a support plate 311 and an injection-molded member 312. In state 203, the support plate 311 includes a main body 311_21, in which various components are disposed, and at least one antenna unit 311a, 311b, 311c, and 311d used as an antenna associated with a communication function of the portable communication device 100. At least a portion of the main body 311_21 may be used as a ground area of the at least one antenna unit 311a, 311b, 311c, or 311d.

The main body 311_21 may include a space for seating a battery, at least one camera module, at least one sensor, at least one PCB having at least one communication chip or communication circuit, a connect hole, a speaker, a microphone, a display, or at least one key input device.

The at least one antenna unit 311a, 311b, 311c, or 311d may include at least one antenna to support such as a third generation (3G) or fourth generation (4G) communication scheme. The at least one antenna unit 311a, 311b, 311c, or 311d may include a first antenna unit 311a disposed at a upper left corner, a second antenna unit 311b disposed at a upper right corner, a third antenna unit 311c disposed at a lower left corner, and a fourth antenna unit 311d disposed at a lower right corner, when viewed from the illustrated drawing. The at least one antenna unit 311a, 311b, 311c, or 311d may further include at least one antenna unit formed on the side surface of the portable communication device and an antenna unit to support a wireless fidelity (WiFi) communication scheme. In addition, the at least one antenna unit 311a, 311b, 311c, or 311d may be involved in signal transmission of a fifth generation (5G) communication module or a communication chip.

The at least one antenna unit 311a, 311b, 311c, or 311d may be provided in an "L" shape and may be disposed to correspond to the shape of the corner of the portable communication device 100. The at least one antenna unit 311a, 311b, 311c, or 311d may be disposed to be spaced apart from a corner of the main body 311_21 by a specific distance and may be connected with the corner of the main body 311_21 through at least one lead. In this regard, the at least one antenna unit 311a, 311b, 311c, or 311d may include at least one lead to be connected with the main body 311_21. Although the at least one lead has been described as a component of the at least one antenna unit 311a, 311b, 311c, or 311d, the at least one lead may be a separate component to connect the at least one antenna unit 311a, 311b, 311c, or 311d with the main body 311_21.

The fourth antenna unit 311d may include a first lead 311_1 and a second lead 311_2 connected with the main body 311_21. The first lead 311_1, the second lead 311_2, and the fourth antenna unit 311d may be formed in a machining process of forming one body. For example, the support plate 311 may be provided with a metal plate in the form of a rectangular panel having a specific thickness and may have a structure including the at least one antenna unit 311a, 311b, 311c, or 311d and at least one lead (e.g., the first lead 311_1 and the second lead 311_2) through computer numerical control (CNC) machining. Alternatively, at least one of the first lead 311_1 or the second lead 311_2 may be directly connected with the main body 311_21 through a separate joining process, and the fourth antenna unit 311d may be connected with the main body 311_21 through at least one of the first lead 311_1 or the second lead 311_2.

The injection molded member 312 may at least partially constitute an outer appearance of the portable communication device 100. For example, the injection molded member 312 may be formed at an edge part of the support plate 311 through a specified injection molding process of injecting an injection material of a non-metal material in a molding process. Injection molded members 312 may be formed at four corners of the housing 310, which include the at least one antenna unit 311a, 311b, 311c, or 311d of the support plate 311, may have a specific width and a specific thickness, and may constitute side surfaces (or the side surfaces and at least portions of the front and rear surfaces) of the portable communication device 100.

When forming the injection molded member 312, a structure to fix the support plate 311 may be applied to the injection molding process such that the support plate 311 is prevented from being shaken. The structure to fix the support plate 311 in the injection molding process may be at least partially formed in at least one of the first lead 311_1 and the second lead 311_2 adjacent to the at least one antenna unit 311a, 311b, 311c, or 311d. Alternatively, the structure to prevent the support plate 311 from being shaken may be applied to a corner area of the housing 310. Hereinafter, the corner area of the housing 310, in which the fourth antenna unit 311*d* is disposed, will be described by way of example. However, the disclosure is not limited thereto. For example, the structure to prevent the support plate 311 from being shaken may be disposed even at a corner area of the housing 310, in which another antenna unit 311*a*, 311*b*, or 311*c* is disposed.

Figure 3:
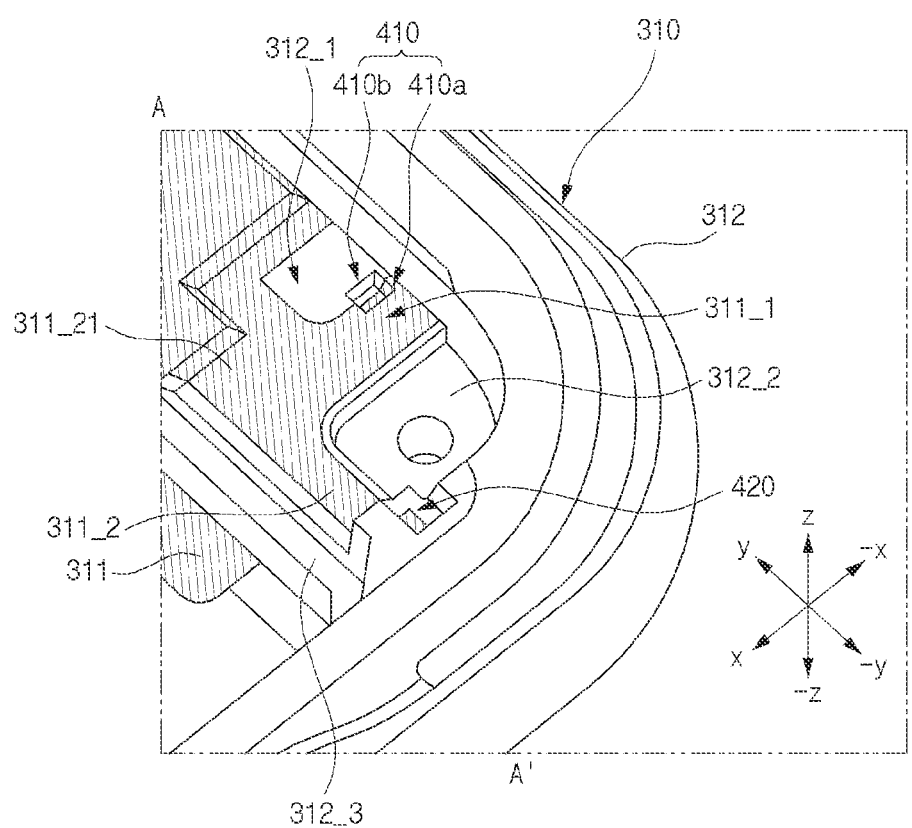
FIG. 3 illustrates a partial area of a housing as illustrated in state 203 of FIG. 2.

FIG. 3 illustrates a partial area of a housing as illustrated in state 203 of FIG. 2.

Referring to FIGS. 2 and 3, at least a portion of the housing 310 may include the support plate 311 and the injection molded member (or molded structure) 312, and the support plate 311 may include at least one of the first lead 311_1 and the second lead 311_2 to connect the main body 311_21 with the fourth antenna unit 311*d*. Although FIGS. 2 and 3 illustrate a structure in which two leads connect the fourth antenna unit 311*d* with the main body 311_21, the disclosure is not limited thereto. For example, the housing 310 of the portable communication device 100 may include one lead or at least three leads between an antenna unit and the main body 311_21.

One edge (e.g., the lower right corner) of the main body 311_21 may connect one side of the first lead 311_1, which extends in an x-axis direction, with one side of the second lead 311_2 which extends in a −y-axis direction. The one side of the main body 311_21 may include at least one groove to seat various components of the portable communication device 100 and at least one hole formed through the main body 311_21 in a Z-axis direction.

The one side of the first lead 311_1 may be connected with one corner of the main body 311_21, and an opposite side of the first lead 311_1 may be connected with the fourth antenna unit 311*d*. The one side of the second lead 311_2 may be spaced apart from the first lead 311_1 by a specific distance and connected with the one corner of the main body 311_21, and an opposite side of the second lead 311_2 may be connected with the fourth antenna unit 311*d*. The first lead 311_1 may be disposed in parallel with the x-axis direction, between the corner of the main body 311_21 and the fourth antenna unit 311*d*, and the second lead 311_2 may be disposed in parallel with the y-axis direction, between the corner of the main body 311_21 and the fourth antenna unit 311*d*. Although FIGS. 2 and 3 illustrate that the first lead 311_1 and the second lead 311_2 extend in the direction of the fourth antenna unit 311*d* from the corner of the main body 311_21 while forming mutually different angles (e.g. 90°) between the first lead 311_1 and the second lead 311_2, the disclosure is not limited thereto. For example, a plurality of leads may be spaced apart from each other by a specific distance while extending in the same x-axis direction or the y-axis direction such that the leads are physically or electrically connected with the fourth antenna unit 311*d*.

An empty space formed by a groove or a hole may be formed in at least a portion of a peripheral portion of at least one lead formed in the support plate 311. An empty space may be formed between the first lead 311_1 and the second lead 311_2, or in a remaining peripheral portion of the at least one of the first lead 311_1 or the second lead 311_2 other than the fourth antenna unit 311*d*. Alternatively, the side surface 110C of the support plate 311 of the portable communication device 100 may be disposed at a peripheral portion of at least one of the first lead 311_1 and the second lead 311_2. The injection molded member 312 may be disposed in the empty space provided in the at least a portion of the peripheral portion of the first lead 311_1 or the second lead 311_2 through the injection molding process.

A first lead injection molded part 312_1 may be disposed in an empty space of the first lead 311_1, which is formed in the y-axis direction, a second lead injection molded part 312_2 may be disposed in an empty space between the first lead 311_1 and the second lead 311_2, and a third lead injection molded part 312_3 may be disposed in an empty space of the second lead 311_2, which is formed in the x-axis direction. At least a portion of the injection molded member 312 may be formed to surround a surface of the fourth antenna unit 311*d*, which faces outward of an x-y plane from a corner of the main body 311_21, of the fourth antenna unit 311*d*.

The housing 310 may include at least a first position adjusting groove 410 and a second position adjusting groove 420, in association preventing the support plate 311 from being shaken. The first position adjusting groove 410 may include a first part 410*a* (or a first partial groove, or a first portion) formed in at least a partial area of the first lead 311_1 to connect the fourth antenna unit 311*d* with one corner of the main body 311_21, and a second part 410*b* (or a second partial groove, or a second portion) formed in the empty space of the first lead 311_1, which is formed in the y-axis direction, adjacent to the first lead 311_1 through the injection molding process and corresponding to a portion of the first lead injection molded part 312-1. The first part 410*a* may be formed through a specific machining grooving process of the support plate 311. The second part 410*b* may be formed through the injection molding process.

The first part 410*a* of the first position adjusting groove 410 may be formed of a first metal material corresponding to a material of the support plate 311 and may include a structure having tilt angles and sidewalls formed in the x-axis −x-axis, and the −y-axis directions, from some edges of the bottom surface. Similarly, the second part 410*b* of the first position adjusting groove 410 may be formed of a non-metal material corresponding to a material of the injection molded member 312 and may include a structure having tilt angles and sidewalls formed in the x-axis, −x-axis, and y-axis directions, from another partial edge of the bottom surface.

A portion of a bottom surface of the first part 410*a*, which is formed in the y-axis direction, and another portion of bottom surface of the second part 410*b*, which is formed in the −y-axis direction, may be joined to each other. The portion of a bottom surface of the first part 410*a* and the another portion of a bottom surface of the second part 410*b* may have substantially identical heights in the z-axis direction. The first position adjusting groove 410 may be supported in the x-axis, −x-axis, −y-axis, and −z-axis directions by a mold rib making contact with the sidewalls of the first part 410*a*, after the mold rib of a mold to fix the first lead 311_1 is seated.

The first position adjusting groove 410 may be formed only in an upper portion of the first lead 311_1 without crossing one side of the first lead 311_1. However, when a structure associated with the fourth antenna unit 311*d* is disposed in the first lead 311_1, the first part 410*a* of the first position adjusting groove 410 may be formed at an edge in the y-axis direction of the first lead 311_1 to ensure a space for the first part 410*a* of the first position adjusting groove 410. Accordingly, the groove structure of the first part 410*a* may have a structure open in the y-axis direction and the z-axis direction.

Although it has been described that the first part 410*a* of the first position adjusting groove 410 is formed at the edge of the first lead 311_1 in the y-axis direction, the disclosure is not limited thereto. For example, the first part 410*a* of the first position adjusting groove 410 may be formed at an edge of the first lead 311_1 in the −y-axis direction. In this case, the second part 410b of the first position adjusting groove 410 may be formed in the second lead injection molded part 312_2, which is disposed in an empty space between the first lead 311_1 and the second lead 311_2 and may be disposed next to the first part 410a.

The first position adjusting groove 410 may be formed in various positions of the upper portion of the first lead 311_1. As the injection molded member 312 associated with forming the edge of the portable communication device 100 is formed to cover the fourth antenna unit 311d and a portion of the first lead 311_1 adjacent to the fourth antenna unit 311d, at least a portion of the first position adjusting groove 410 may be formed in a portion (or a position, which is closer to the corner of the main body 311_21 of the fourth antenna unit 311d and the main body 311_21) of the first lead 311_1, which is adjacent to the corner of the main body 311_21. The position of the first position adjusting groove 410 may be varied depending on the shape of the corner of the injection molded member 312. For example, at least the first part 410a of the first position adjusting groove 410 may be formed in a portion of the first lead 311_1 which is closer to the fourth antenna unit 311d of the fourth antenna unit 311d and the main body 311_21.

At least a portion of a second position adjusting groove 420 may be disposed in the second lead 311_2 or in an area adjacent to the second lead 311_2. A portion, which is formed in the second lead 311_2, of the second position adjusting groove 420 may have a structure including two sidewalls in the x-axis direction and the y-axis direction and is open in the −x-axis and −y-axis directions. A remaining portion of the second position adjusting groove 420 may be formed next to a portion of the second position adjusting groove 420, which is formed in an area (or the second lead 311_2) adjacent to the second lead 311_2, in the second lead injection molded part 312_2 between the first lead 311_1 and the second lead 311_2. As a portion, which is formed in the second lead 311_2, of the second position adjusting groove 420 includes two sidewalls formed in two directions, when the mold rib of the mold is inserted into the second position adjusting groove 420, the sidewalls of the second position adjusting groove 420 in the two directions, the bottom surface of the second position adjusting groove 420, and the mold rib are fitted to each other to support the second lead 311_2 in three directions.

Although a structure has been described in which a groove open in at least two directions and corresponding to at least a portion of one position adjusting groove is formed in one lead, the disclosure is not limited thereto. For example, at least one position adjusting groove or a partial groove corresponding to a portion of the position adjusting groove may be formed in at least one lead of the support plate 311. As described above, the support plate 311 may be coupled to a mold in the injection molding process, based on at least one position adjusting groove formed in a lead such that the support plate 311 is prevented from being shaken. In addition, a pressure may be applied to the mold and the mold rib such that the support plate 311 may endure the applied pressure while an injection material (e.g., a polymer material or a plastic material) is being injected into the mold in the injection molding process. Accordingly, at least one lead, which connects at least one antenna unit with the main body, is prevented from being broken and deformed and the shape of the injection molded member is stably formed.

As described above, four surfaces of the support plate 311 are supported by using a mold such that the support plate 311 is prevented from being deformed in a horizontal direction. To this end, grooves are provided in a lead necessary for preventing deformation to support two or three surfaces such that the support plate 311 is prevented from being deformed. The support plate 311 may also be prevented from being shaken leftward or rightward. Accordingly, antenna performance may be ensured in at least a part used as an antenna, and the support plate 311 may be prevented from being broken or from protruding while penetrating through the injection molded member 312 to the extent that the protrusion is observed. In addition, a position adjusting groove for preventing shaking in a horizontal direction may be added to prevent the support plate 311 from being deformed in the horizontal direction due to injection pressure. Accordingly, the yield rate and hardware performance of a product may be improved.

Figure 4:
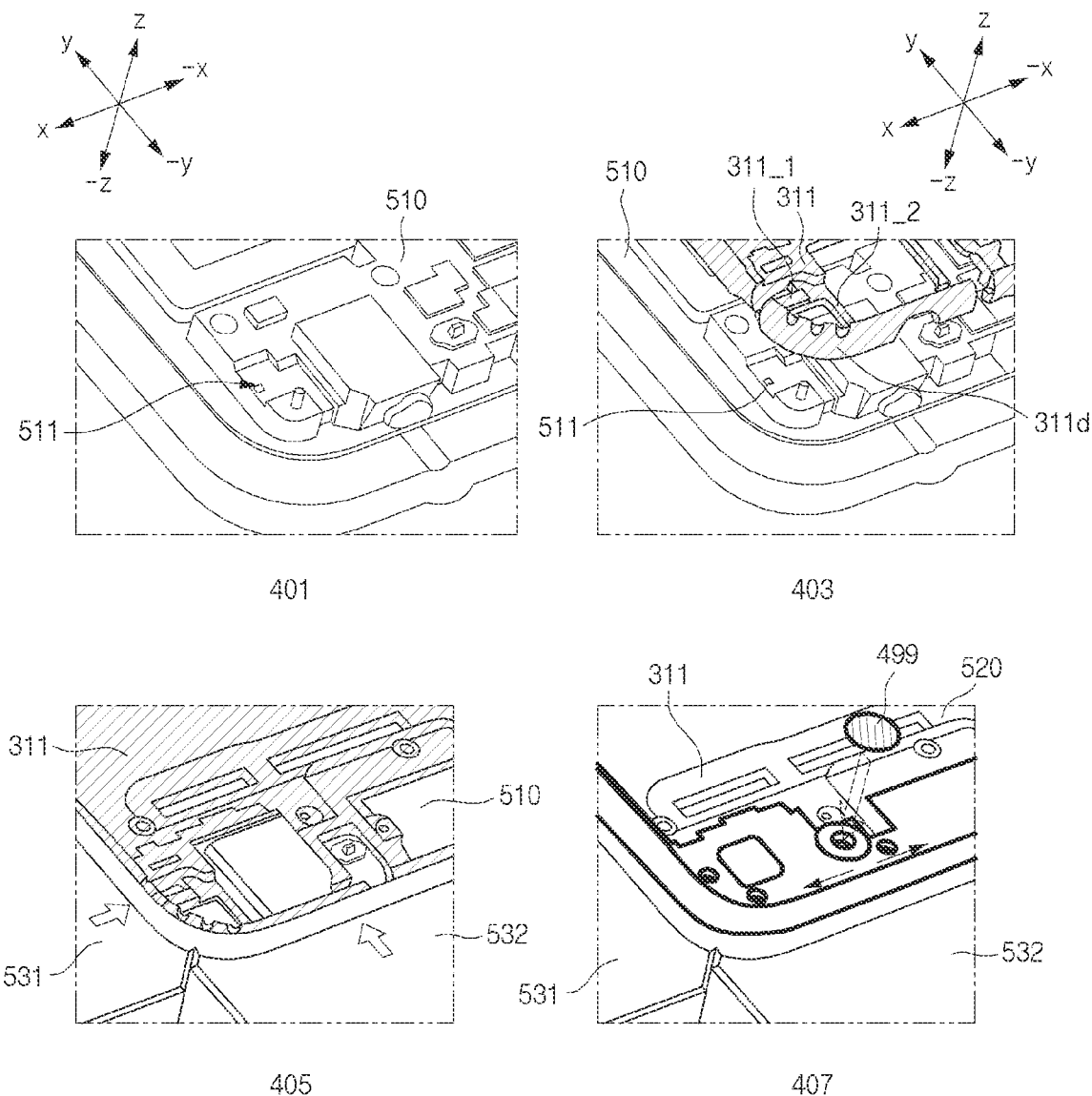
FIG. 4 illustrates an injection molding process associated with a housing, according to an embodiment.

FIG. 4 illustrates an injection molding process associated with a housing, according to an embodiment.

Referring to FIGS. 2 to 4, a lower mold 510 may be disposed as illustrated in state 401 in association with the injection molding process. The lower mold 510 may include a shape corresponding to at least a portion of any one of the first surface and the second surface of the housing 310. Alternatively, at least a portion of the lower mold 510 may include a shape corresponding to a first surface or a second surface of the support plate 311. The overall size of the lower mold 510 may be equal to or larger than the overall size of the support plate 311 or the size of the first surface or the second surface of the housing 310. The lower mold 510 may have the structure including the shape corresponding to the shape of the first surface or the second surface of the support plate 311 and the shape of the first surface or the second surface corresponding to the injection molded member 312 except for the support plate 311, of the housing 310. The lower mold 510 may be formed of a metal material having a melting point higher than a melting point of an injection material (e.g., resin). The lower mold 510 may include a space corresponding to the shape of the injection molded member 312 to cover at least a portion of the at least one antenna unit 311a, 311b, 311c, or 311d.

The lower mold 510 may include a mold rib 511. The mold rib 511 may include the shape of a protrusion (or a projection part, an engraved part, a roughness part) corresponding to the first position adjusting groove 410 or the second position adjusting groove 420. At least a portion of an upper end protruding in the z-axis direction of the mold rib 511 has a gradually reduced shape, in thickness and width, upward in the z-axis direction. Alternatively, the sectional surface, which corresponds to an x-y plane, of the mold rib 511 may have a polygonal oval shape including a circular shape. The mold rib 511 may be provided in the gradually reduced shape, in an area of a sectional surface corresponding to the x-y plane, upward from a bottom surface of the mold rib 511. The upper end of the mold rib 511 may have a flat area. The sectional surface corresponding to the z-y plane or the sectional surface corresponding to the z-x plane of the mold rib 511 may include a trapezoidal shape.

As illustrated in state 403, the support plate 311 may be aligned and disposed on the lower mold 510. In this process, at least one of the first lead 311_1 or the second lead 311_2, which connects at least the fourth antenna unit 311d of the support plate 311 with the main body 311_21, and the mold rib 511 may be aligned in the z-axis direction. Although it is illustrated that the first lead 311_1 and the mold rib 511 are aligned with each other, the disclosure is not limited thereto. For example, the lower mold 510 described with reference to state 401 may include the mold rib 511 aligned with a portion of the first lead 311_1 in the z-axis direction, and may further include a mold rig aligned with portion of the second lead 311_2 in the z-axis direction. Additionally or alternatively, the lower mold 510 may further include at least one mold rib disposed at a position aligned with at least one lead, which connects the first antenna unit 311a, the second antenna, and the third antenna unit 311c with the main body 311_21, in the z-axis direction.

After disposing the support plate 311 on the lower mold 510, a side surface of the lower mold 510, on which the support plate 311 is seated, may be closed by using at least a first slider 531 and/or a second slider 532 as illustrated in state 405. Although it is illustrated that the first slider 531 and the second slider 532 are disposed to surround side portions of the lower mold 510, as only a portion of the lower mold 510 is illustrated, four sliders may be provided to surround side surfaces of the support plate 311, which is mounted on the lower mold 510, in four directions. Accordingly, four sliders may be disposed to surround side surfaces of the lower mold 510, on which the support plate 311 is mounted, in four directions. As four sliders surround the side surfaces of the lower mold 510, an opening, which has a size corresponding to the size of the housing 310, may be formed in an upper portion of the lower mold 510 on which the support plate 311 is mounted.

As illustrated in state 407, an upper mold 520 may be disposed to cover the area opened upward in the z-axis direction when a plurality of sliders surround the side portions of the lower mold 510. The upper mold 520 may include a structure corresponding to at least a portion of the second surface or the first surface of the support plate 311. Alternatively, the upper mold 520 may include a structure corresponding to at least a portion of the second surface or the first surface of the housing 310. The upper mold 520 may have an injection hole into which an injection material 499 (or resin) may be injected.

Figure 5:
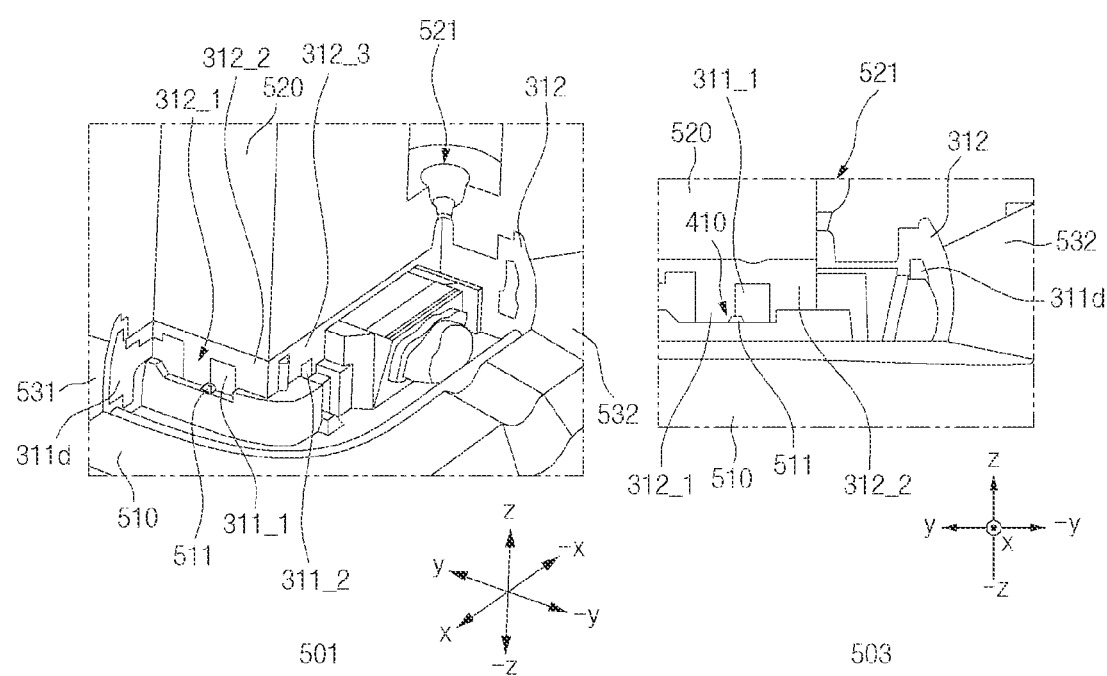
FIG. 5 illustrates the assembling state of molds and the arrangement state of a resin in a resin injection process, according to an embodiment.

FIG. 5 illustrates the assembling state of molds and the arrangement state of a resin in a resin injection process, according to an embodiment.

Referring to FIGS. 4 and 5, as illustrated in states 501 and 503, the upper mold 520 may include an injection hole 521 through which the injection material 499 (or resin) is injected. The support plate 311 may be disposed between the lower mold 510 and the upper mold 520, and an empty space for injecting the injection material may be formed between the lower mold 510 and the upper mold 520. The empty space may be formed between support plates 311. The injection material 499 may be introduced through the injection hole 521, injected in an arrow direction illustrated in the drawing, and filled in the empty space formed between the support plates 311. The injection material 499 may be injected to surround at least a portion of the fourth antenna unit 311d to form at least a portion of the injection molded member 312. Alternatively, the injection material 499 may be injected into at least a portion of the empty space adjacent to the first lead 311_1, the empty space between the first lead 311_1 and the second lead 311_2, and the empty space adjacent to the second lead 311_2. As the injection material 499 is injected, the first lead injection-molded part 312_1, the second lead injection molded part 312_2, and the third lead injection molded part 312_3 may be at least formed. The injection material 499 is injected into the contact area between the mold rib 511 of the lower mold 510 and a portion of the first lead 311_1, thereby forming the first position adjusting groove 410 including a partial groove of the first lead 311_1 and a portion of the first lead injection molded part 312_1.

Figure 6:
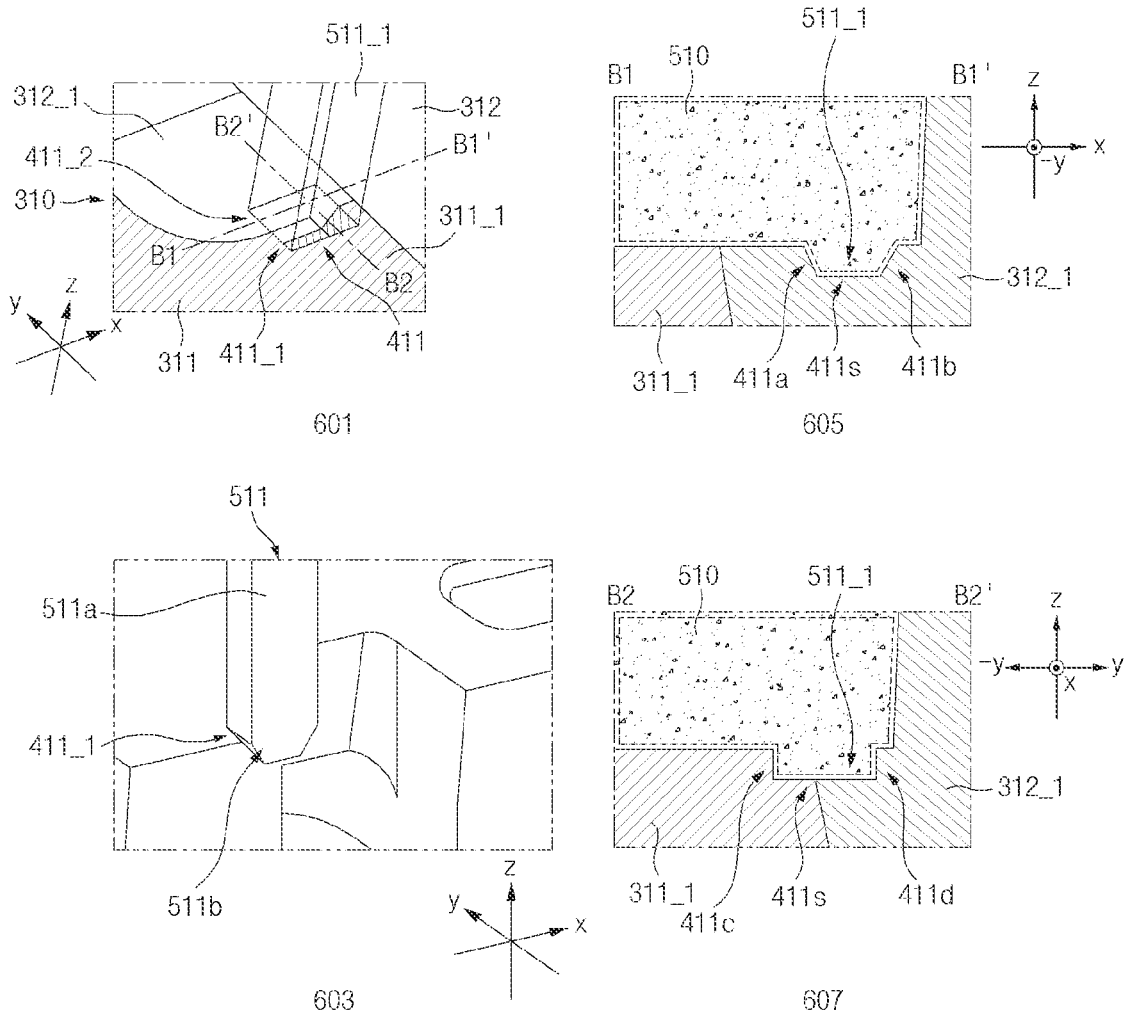
FIG. 6 illustrates a first-type position adjusting groove, according to an embodiment.

FIG. 6 illustrates a first-type position adjusting groove, according to an embodiment.

Referring to FIG. 6, as illustrated in state 601, at least a portion of the housing 310 may include a portion of the support plate 311 and a portion of the injection molded member 312. For example, the support plate 311 may include the first lead 311_1 connected with at least one antenna unit, and the injection molded member 312 may include a first lead injection molded part 312_1 formed adjacent to the first lead 311_1. The housing 310 may include a first-type position adjusting groove 411 including one side of the first lead 311_1 and one side of the first lead injection molded part 312_1. The first-type position adjusting groove 411 includes a first part 411_1, which is formed at the side of the first lead 311_1, and a second part 411_2, which is at least partially connected with the first part 411_1 and formed in the first lead injection molded part 312_1.

Referring to state 603, a portion of the above-described groove formed in the first lead 311_1 may be provided before the injection molding process, such that a portion of a first-type mold rib 511_1 of the lower mold 510 is mounted and aligned. A groove portion formed in the first lead injection molded part 312_1 of the first-type mold rib 511_1 may be provided during the injection molding process. The first-type mold rib 511_1 may be formed to protrude from a top surface facing the z-axis direction of the lower mold 510 to be higher than a peripheral portion of the first-type mold rib 511_1. The first-type mold rib 511_1 may include a body part 511a, which has a longer length in the z-axis direction or the −z-axis direction than a length in another direction and is provided in a polygonal column shape, and a header 511b which is formed at an end portion of the first-type mold rib 511_1 in the −z-axis direction and at least partially inserted into the first-type position adjusting groove 411. The header 511b of the firs-type mold rig 511_1 having the polygonal column shape may be provided in the gradually reduced shape in an x-axis directional width toward a −z-axis directional edge from a specific position. At least a portion of the header 511b of the first-type mold rib 511_1 may be inserted into the first part 411_1 of the first-type position adjusting groove 411, to be fitted to the bottom surface and the sidewalls of the first part 411_1.

State 605 illustrates a sectional view taken along line B1-B1' of state 601. Referring to state 605, the upper mold 520 may be disposed to cover one surface of the support plate 311 in the z-axis direction, and to cover an empty space having no support plate 311 in the −z-axis direction. The first-type position adjusting groove 411 may include a first sidewall 411a having a tilt angle greater than 0 degrees (°) and less than 90° in the −x-axis direction. That is, a tilt angle is provided in the range of 60° to 70° with respect to a line extending in the −x-axis direction from a flat bottom surface 411s of the first-type position adjusting groove 411 (alternatively, the first sidewall 411a has a tilt angle in the range of 20° to 30° formed with respect to a line extending from a surface, on which the upper mold 520 is fitted to the support plate 311, in the direction of the flat bottom surface 411s of the first-type position adjusting groove 411). The first-type position adjusting groove 411 may include a second sidewall 411b having a tilt angle equal to the tilt angle of the first sidewall 411a, which is formed with respect to a line extending in in −x-axis direction from the flat bottom surface 411s. The first sidewall 411a and the second sidewall 411b may be disposed to face each other, when viewed based on the bottom surface 411s. A portion in the −y-axis direction of the first sidewall 411a may be included in the first part 411_1, and a portion in the y-axis direction of the first sidewall 411*a* may be included in the second part 411_2. Accordingly, the portion of the first sidewall 411*a* may include a metal material, and the another portion of the first sidewall 411*a* may include a non-metal material or a structure formed by hardening resin for injection. Similarly, a portion in the −y-axis direction of the second sidewall 411*b* may be included in the first part 411_1, and a portion in the y-axis direction of the second sidewall 411*b* may be included in the second part 411_2. Accordingly, the portion of the second sidewall 411*b* may include a metal material, and the another portion of the second sidewall 411*b* may include a non-metal material or a structure formed by hardening resin for injection.

State 607 illustrates a sectional view taken along line B2-B2' of state 601. Referring to state 607, the first-type position adjusting groove 411 may include a third sidewall 411*c* and a fourth sidewall 411*d* which is formed in the z-axis direction perpendicularly to the bottom surface 411*s*. The third sidewall 411*c* and the fourth sidewall 411*d* may disposed to face each other, when viewed based on the bottom surface 411*s*.

The third sidewall 411*c* and the fourth sidewall 411*d* may constitute a titled surface having a tilt angle of at least 20° formed with respect to a line extending in the −z-axis direction from the top surface of the support plate 311, and the first sidewall 411*a* and the second sidewall 411*b* may constitute a sidewall formed in the z-axis direction perpendicularly to the boom surface 411*s*.

As described above, in the injection molding process for the housing 310, the coupled surface between the first-type mold rib 511_1 and the support plate 311 may be designed to be inclined. Accordingly, the mold may transfer force, which is normally applied downward, to the titled surface to ensure a proper fitting surface. In addition, in the injection molding process, resin or an injection material may be prevented from overflowing or being introduced between the support plate 311 and the first-type mold rib 511_1. Alternatively, the edge breakage in the support plate 311 and the mold core (or mold rib) may be improved, and the position adjusting groove may be utilized as a guide for correcting the position of the support plate 311. In addition, the first-type position adjusting groove 411 may fix the support plate 311 through the mold, based on the shape of fitting-titled surfaces, such that the support plate 311 is prevented from being shaken leftward or rightward due to the injection pressure.

As described above, the first-type mold rib 511_1 is provided in a mold to prevent the support plate 311 from being shaken leftward or rightward across two areas including the support plate 311 and the injection molded member 312. In addition, the contact surfaces between the first-type mold rib 511_1 to prevent the mold from being shaken, and the support plate 311 are provided as titled surfaces for fitting such that resin is prevented from overflowing. Accordingly, an injection material (or injection resin or resin) is prevented from overflowing into an unintentional area, while the upper mold and the lower mold vertically press the support plate 311.

Figure 7:
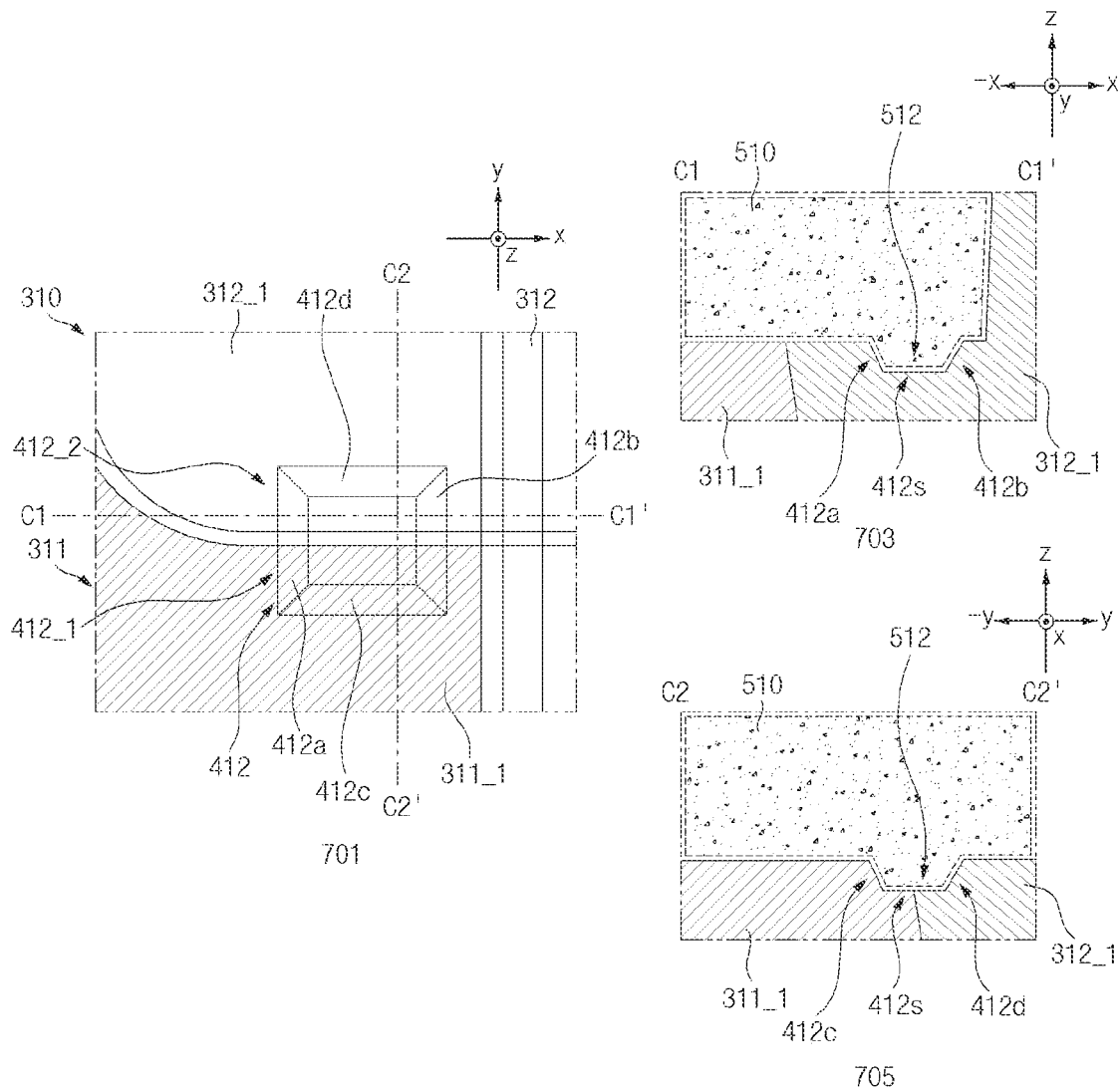
FIG. 7 illustrates a second-type position adjusting groove, according to an embodiment.

FIG. 7 illustrates a second-type position adjusting groove, according to an embodiment.

In FIG. 7, state 701 illustrates a portion of the housing 310 in which a second-type position adjusting groove 412 is disposed, state 703 illustrates at least a portion of a sectional view taken along line C1-C1' in state 701, and state 705 illustrates at least a portion of a sectional view taken along line C2-C2' of state 701 Referring to state 701, at least a portion of the housing 310 may include a portion of the support plate 311 and a portion of the injection molded member 312. The support plate 311 may include at least the first lead 311_1, and the injection molded member 312 may include the first lead injection molded part 312_1. The second-type position adjusting groove 412 includes a first part 412_1, which is formed in the first lead 311_1, and a second part 411_2, which is formed in the first lead injection molded part 312_1. The first part 412_1 may have sidewalls formed in the −x-axis, x-axis, and −y-axis directions at some edges of the bottom surface 412*s* (see state 703) and may be provided in the form of a groove open in the y-axis and z-axis directions. The second part 412_2 may have sidewalls formed in the −x-axis, x-axis, and y-axis directions at some other edges of the bottom surface 412*s* and may be provided in the form of a groove open in the −y-axis and z-axis directions. The opening of the first part 412_1 in the y-axis direction may be connected with the opening of the second part 412_2 in the −y-axis direction. The first part 412_1 and the second part 412_2 are open in the z-axis direction to completely form a second-type position adjusting groove 412.

Referring to state 703, the second-type position adjusting groove 412 may include a bottom surface 412*s*, a first sidewall 412*a*, which has an angle greater than 0° formed with respect to a line extending in the z-axis direction from a first-side edge (provided in the −x-axis direction based on the center of the bottom surface 412*s*, and a second sidewall 412*b* which has a tilt angle greater than 0° foamed with respect to a line extending in the z-axis direction from a second-side edge facing the first-side edge of the bottom surface 412*s*, and is positioned in the x-axis direction from the center of the bottom surface 412*s*.

Referring to states 701 and 703, a portion of the first sidewall 412*a* and a portion of the second sidewall 412*b* are included in the first part 412_1, and another portion of the first sidewall 412*a* and another portion of the second sidewall 412*d* may be included in the second part 412_2. A portion of the first sidewall 412*a*, which corresponds to the first part 412_1 and includes a first material, may be joined to another portion of the first sidewall 412*a*, which corresponds to the second part 412_2 and includes a second material. Similarly, a portion of the second sidewall 412*b*, which corresponds to the first part 412_1 and includes the first material, may be joined to another portion of the second sidewall 412*b*, which corresponds to the second part 412_2 and includes the second material.

Referring to state 705, the second-type position adjusting groove 412 may include a bottom surface 412*s*, a third sidewall 412*c* which has an angle greater than 0° formed with respect to a line extending in the z-axis direction from a third-side edge provided in the −y-axis direction based on the center of the bottom surface 412*s*, and a fourth sidewall 412*d* which has a tilt angle greater than 0° with respect to a line extending in the z-axis direction from a fourth-side edge facing the third-side edge of the bottom surface 412*s*, and is positioned in the y-axis direction from the center of the bottom surface 412*s*. The third sidewall 412*c* may be included in the first part 412_1, and the fourth sidewall 412*d* may be included in the second part 412_2. The third-side edge provided in the −y-axis direction based on the center of the bottom surface 412*s* may be interposed between the first-side edge and the second-side edge of the bottom surface 412*s*, and the fourth-side edge may be positioned while facing the third-side edge. A portion of the bottom surface 412*s* may be positioned in the first part 412_1, and another portion of the bottom surface 412*s* may be positioned in the second part 412_2. Accordingly, the bottom surface 412s may be formed by joining two layers including a metal material and a non-metal material.

As the above-described second-type position adjusting groove 412 is formed by the four sidewalls 412a, 412b, 412c, and 412d having specific angles based on the bottom surface 412s, while the second-type rib 512 of the upper mold 520 is seated in the second-type position adjusting groove 412, friction between the edge of a second-type mold rib 512 and the first lead 311_1 may be minimized, thereby reducing the abrasion and the breakage of the second-type mold rib 512. In addition, as the fitting surface of the second-type mold rib 512 is matched with the fitting surface of the second-type position adjusting groove 412, stable and uniform pressure is applied to the second-type position adjusting groove 412 through the second-type mold rib 512. Accordingly, the second lead 311_2 may be more securely positioned and prevented from being shaken.

The fitting-side surface (or a side surface of a mold rib) of a rectangular mold may not sufficiently receive mold opening force, and thus may be weak when resin overflows. Accordingly, a tilt angle from the top surface of the support plate 311 toward the bottom surface 412s of at least one sidewall is formed at 20° or 30° or more, such that a fitting area of the side surface is expanded, thereby preventing the resin from overflowing. In addition, a titled surface is formed at one side of a mold rib to prevent the mold from being shaken, thereby preventing the mold from being broken in a corner such that the endurance is ensured.

A one-directional length of an upper portion of the opening positioned in line with the top surface of the support plate 311 of the second-type position adjusting groove 412 of the mold rib may be about 0.6 millimeters (mm) to 1.0 mm and have a polygonal shape, such as a diamond or an oval shape. The depth of the second-type position adjusting groove 412 may be in the range of about 0.3 mm to 0.5 mm. In addition, as the depth of the second-type position adjusting groove 412 is increased, the mold or mold rib may more easily break. Accordingly, the size of the support plate 311 may be adjusted. The tilt angle or inclination in the z-axis direction from the bottom surface 412s or the inclination toward the bottom surface 412s from the top surface of the support plate 311, of the second-type position adjusting groove 412 may be in the range of 20° to 30°. As the mold clamping force of the mold is distributed to the tilted surfaces, the tilted surfaces may prevent the support plate 311 from being shaken leftward or rightward, may improve the fitting force between the injection resin and the support plate 311, and may serves as an assembling guide when the support plate 311 is inserted into the mold, in the injection molding process.

Figure 8:
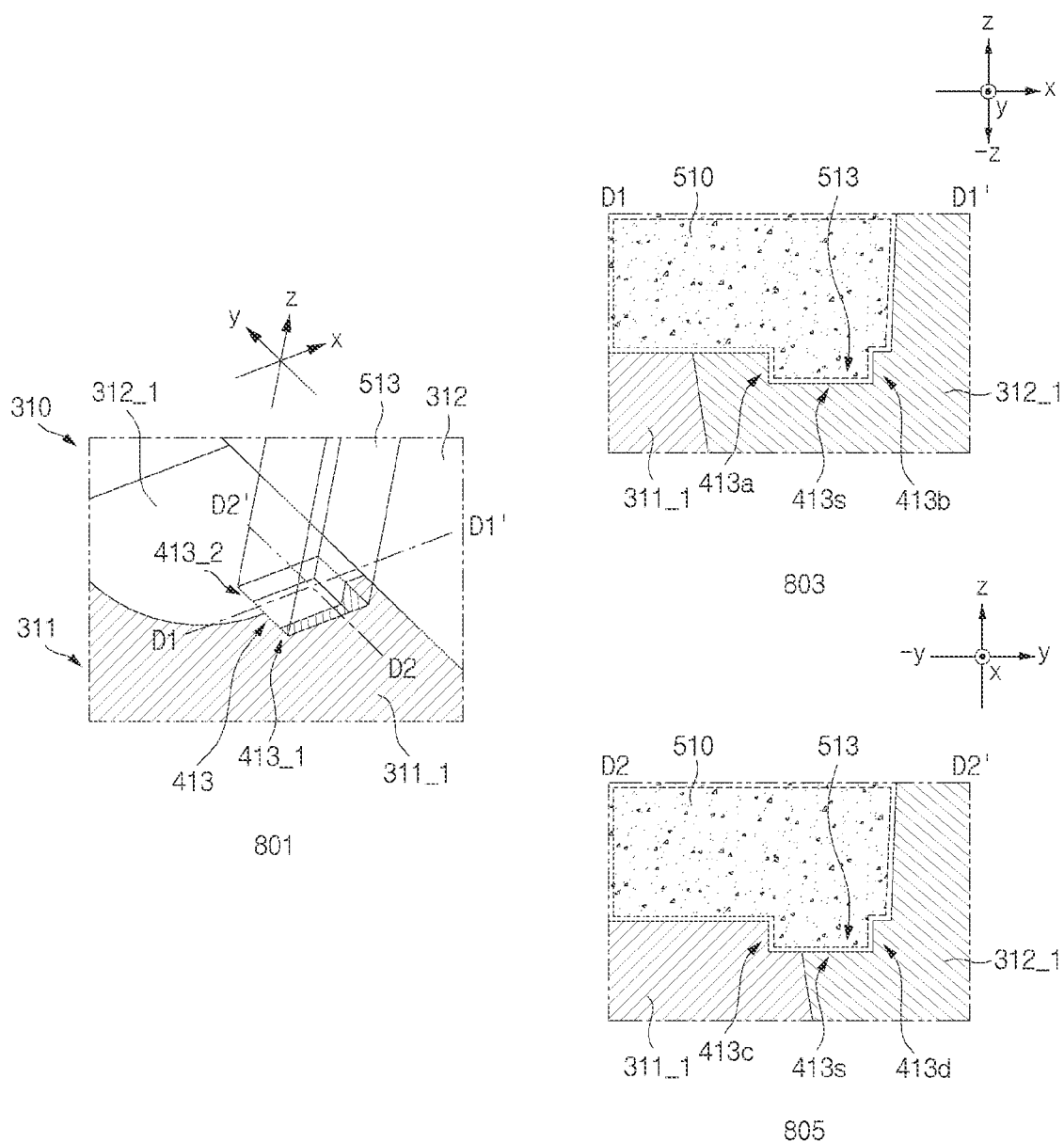
FIG. 8 illustrates a third-type position adjusting groove, according to an embodiment.

FIG. 8 illustrates a third-type position adjusting groove, according to an embodiment.

In FIG. 8, state 801 illustrates a portion of the housing 310 in which a third-type position adjusting groove 413 is disposed, state 803 illustrates at least a portion of a sectional view taken along line D1-D1' in state 801, and state 805 illustrates at least a portion of a sectional surface taken along line D2-D2' of state 801. Referring to state 801, at least a portion of the housing 310 may include a portion of the support plate 311 and a portion of the injection molded member 312. The support plate 311 may include at least the first lead 311_1, and the injection molded member 312 may include the first lead injection molded part 312_1. The third-type position adjusting groove 413 includes a first part 413_1, which is formed in the first lead 311_1, and a second part 413_2, which is formed in the first lead injection molded part 312_1. The first part 413_1 may have sidewalk formed in the −x-axis, x-axis, and −y-axis directions at some edges of a bottom surface 413s, and may be provided in the form of a groove open in the y-axis and z-axis directions, The second part 413_2 may have sidewalls formed in the −x-axis, x-axis, and y-axis directions at some other edges of the bottom surface 413s, and may be provided in the form of a groove open in the −y-axis and the z-axis directions. The opening of the first part 413_1 in the y-axis direction may be connected with the opening of the second part 413_2 in the −y-axis direction. The first part 413_1 and the second part 413_2 are open in the z-axis direction to completely form a third-type position adjusting groove 413.

Referring to state 803, the third-type position adjusting groove 413 may include a bottom surface 413s, a first sidewall 413a vertically extending in the z-axis direction from a first-side edge provided in the −x-axis direction based on the center of the bottom surface 413s, and a second sidewall 413b vertically extending in the z-axis direction from a second-side edge facing the first-side edge of the bottom surface 413s, and positioned in the x-axis direction from the center of the bottom surface 413s. A portion of the first sidewall 413a and a portion of the second sidewall 413b are included in the first part 413_1, and another portion of the first sidewall 413a and another portion of the second sidewall 413b may be included in the second part 413_2. A portion of the first sidewall 413a including a first material (e.g., a metal material) may be joined to another portion of the first sidewall 413a including a second material (e.g., a structure obtained by hardening a non-metal material or resin for injection). Similarly, a portion of the first sidewall 413b including the first material (e.g., a metal material) may be joined to another portion of the second sidewall 413b including the second material (e.g., a structure obtained by hardening a non-metal material or resin for injection).

Referring to state 805, the third-type position adjusting groove 413 may include a bottom surface 413s, a third sidewall 413c vertically extending in the z-axis direction from a third-side edge provided in the −y-axis direction based on the center of the bottom surface 413s, and a fourth sidewall 413d vertically extending in the z-axis direction from a fourth-side edge facing the third-side edge of the bottom surface 413s, and positioned in the y-axis direction from the center of the bottom surface 413s. The third sidewall 413c may be included in the first part 413_1, and the fourth sidewall 413d may be included in the second part 413_2. The third-side edge provided in the −y-axis direction based on the center of the bottom surface 413s may be interposed between the first-side edge and the second-side edge of the bottom surface 413s. A portion of the bottom surface 413s may be positioned in the first part 413_1, and another portion of the bottom surface 413s may be positioned in the second part 413_2. Accordingly, the bottom surface 413s may be formed by joining two layers including mutually different materials (e.g., a metal material and a non-metal material) At least a portion of the third-type position adjusting groove 413 may constitute a rectangular empty space, which is open in the z-axis direction.

As the third-type position adjusting groove 413 has the four sidewalk 413a, 413b, 413c, and 413d formed perpendicularly to the bottom surface 413s, the size of one sectional surface corresponding to the x-y plane of a third-type mold rib 513 of the upper mold 520 is less than or equal to the size of an opening of the third-type position adjusting groove 413 when viewed in the z-axis direction. As described above, the third-type mold rib 513 may be disposed while crossing an area between the support plate 311 and the injection molded member 312, thereby reducing the phenomenon in which the resin for injection is directly introduced between the support plate 311 and the mold.

Figure 9:
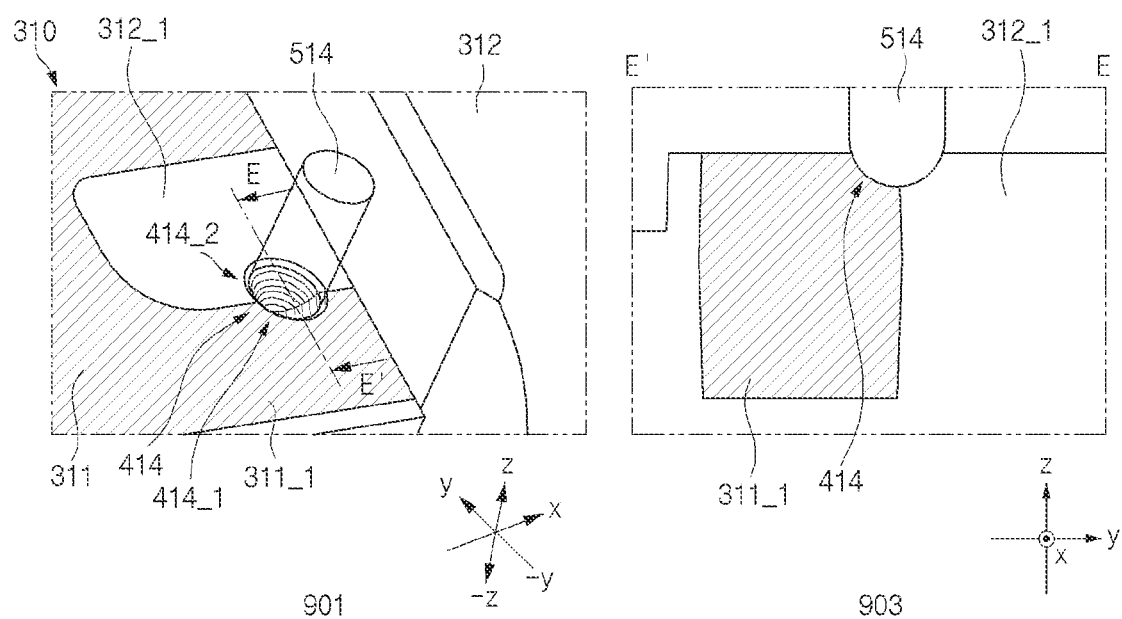
FIG. 9 illustrates a fourth-type position adjusting groove, according to an embodiment.

FIG. 9 illustrates a fourth-type position adjusting groove, according to an embodiment.

In FIG. 9, state 901 illustrates a portion of the housing 310 in which a fourth-type position adjusting groove 414 is disposed, and state 903 illustrates at least a portion of a sectional surface taken along line E-E' of state 901. Referring to state 901, at least a portion of the housing 310 may include a portion of the support plate 311 and a portion of the injection molded member 312. The support plate 311 may include at least the first lead 311_1, and the injection molded member 312 may include the first lead injection molded part 312_1. The fourth-type position adjusting groove 414 includes a first part 414_1, which is formed in the first lead 311_1, and a second part 414_2, which is formed in the first lead injection molded part 312_1. The first part 414_1 may constitute a portion of a semi-sphere having a specific curvature in the −z-axis direction and engraved in the −z-axis and −y-axis directions. The second part 414_2 may constitute another portion of a semi-sphere having a specific curvature in the −z-axis direction and engraved in the −z-axis and y-axis directions. A concave surface of the first part 414_1 in the −z-axis direction may constitute a portion of the fourth-type position adjusting groove 414, and a concave surface of the second part 414_2 in the −z-axis direction may constitute another portion of the fourth-type position adjusting groove 414. The concave surfaces of the first part 414_1 and the concave surface of the second part 414_2 are connected to each other and may form a semi-spherical groove. The space corresponding to the first part 414_1 and the space corresponding to the second part 414_2 may be open in the z-axis direction while communicating with each other. The fourth-type position adjusting groove 414 may have the shape of a semi-spherical groove engraved in the −z-axis direction, at the contact part between the first lead 311_1 and the first lead injection molded member 312. In this regard, at least an end portion of an edge in the −z-axis direction of a fourth-type mold rib 514 of the upper mold 520 may be provided in the shape of a semi-sphere.

Referring to state 903, top surfaces of the first lead 311_1 and a first lead injection-molded molded part 312_1 are aligned in line with each other in the z-axis direction, and one sidewall of the first lead 311-1 and one sidewall of the first lead injection-molded molded part 312_1 may be bonded to each other. The fourth-type mold rib 514 may be positioned at the boundary between the first lead 311_1 and the first lead injection molded part 312_1. The first part 414_1, which is to seat a portion of the end portion of the edge of the fourth-type mold rib 514, may be formed in the first lead 311_1 before the injection molding process is performed. The second part 414_2 may be produced in a space adjacent to the first lead 311_1, when a material for the injection is injected and hardened through the injection molding process, and while the fourth-type mold rib 514 is joined to the first part 414_1.

The first part 414_1, which is curved, of the fourth-type position adjusting groove 414 having the shape of the semi-sphere may provide a uniform fitting surface with respect to the fourth-type mold rib 514 having the shape of the semi-sphere. Alternatively, as the one end portion of the fourth-type mold rib 514 is provided in the shape of the semi-sphere, friction between the fourth-type mold rib 514 and the fourth-type position adjusting groove 414 may be reduced while the fourth-type mold rib 514 is coupled to the fourth-type position adjusting groove 414, such that breakage or the abrasion of the fourth-type mold rib 514 is prevented.

Figure 10:
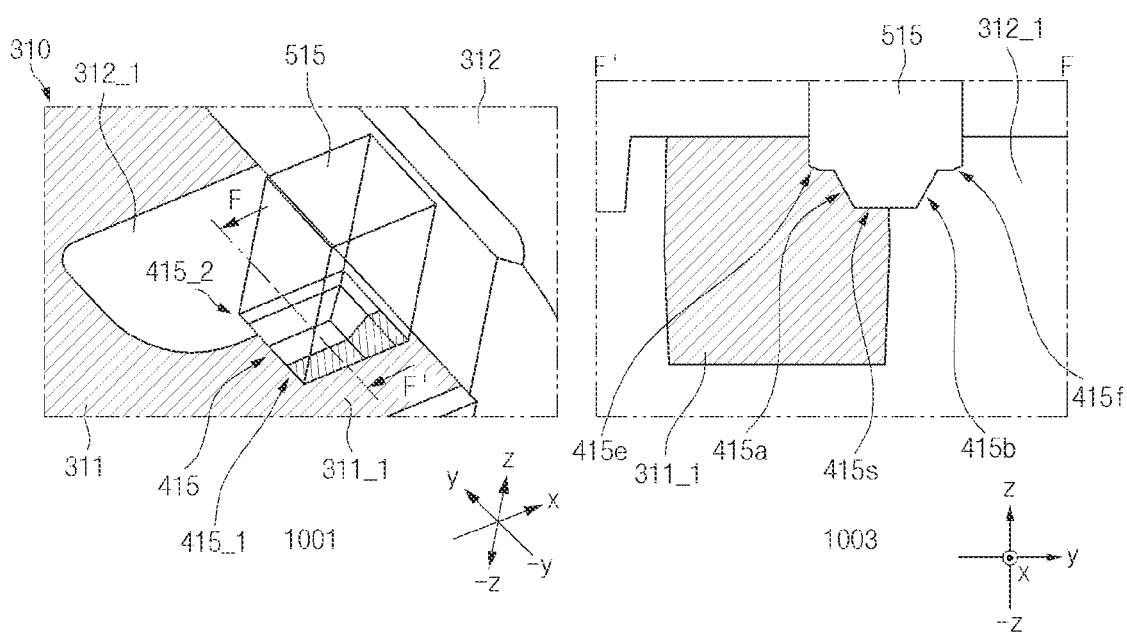
FIG. 10 illustrates a fifth-type position adjusting groove, according to an embodiment.

FIG. 10 illustrates a fifth-type position adjusting groove, according to an embodiment.

In FIG. 10, state 1001 illustrates a portion of the housing 310 in which a fifth-type position adjusting groove 415 is disposed, state 1003 illustrates at least a portion of a sectional surface taken along line F-F' of state 1001 Referring to state 1001, at least a portion of the housing 310 may include a portion of the support plate 311 and a portion of the injection molded member 312. The injection molded member 312 may include at least the first lead 311_1, and the injection molded member 312 may include the first lead injection molded part 312_1. The fifth-type position adjusting groove 415 includes a first part 415_1, which is formed in the first lead 311_1, and a second part 415_2, which is formed in the first lead injection molded part 312_1. The first part 415_1 may have sidewalls stepped in the −x-axis direction, the x-axis direction, and −y-axis direction at some other edges of the bottom surface 415s and may be provided in the form of a groove open in the y-axis and z-axis directions. The second part 415_2 may have sidewalls stepped in the −x-axis n, x-axis, and −y-axis directions, and may be provided in the form of a groove open in the −y-axis and z-axis directions. The opening of the first part 415_1 in the y-axis direction may be connected with the opening of the second part 415_2 in the −y-axis direction. The first part 415_1 and the second part 415_2 are open in the z-axis direction to completely form the fifth-type position adjusting groove 415.

Referring to state 1003, a first sidewall of the fifth-type position adjusting groove 415 may include a first titled surface 415a, which has an angle greater than 0° formed with respect to a line extending in the z-axis direction from a first-side edge of a bottom surface 415s and is positioned in the −x-axis direction from the center of the bottom surface 415s, and a first curved surface 415e, which extends toward a top surface facing the z-axis direction of the first lead 311_1 from an end portion facing the z-axis direction of the first titled surface 415a and is engraved (or concave) in the −z-axis direction. For example, the first curved surface 415e may include a surface which is interposed between a top surface of the support plate 311 (or the first lead 311_1) and an upper end portion facing the z-axis direction of the first titled surface 415a, and has a specific curvature in the −z-axis direction. The second sidewall may include a second titled surface 415b, which has a tilt angle greater than 0° formed with respect to a line extending in the z-axis direction from a second-side edge facing a first-side edge and is positioned in the x-axis direction from the center of the bottom surface 415s, and a second curved surface 415f which extends toward a top surface facing the z-axis direction of the first lead 311_1 from an end portion facing the z-axis direction of the second titled surface 415b, and is engraved (or curved) in the −z-axis direction. For example, the second curved surface 415f may include a surface which is interposed between the top surface of the support plate 311 (or the first lead 311_1) and an upper end portion facing the z-axis direction of the second titled surface 415b, and has a specific curvature in the −z-axis direction. Additionally or alternatively, the fifth-type position adjusting groove 415 may include four sidewalls as illustrated in state 1001. For example, a third sidewall and a fourth sidewall are formed between a first sidewall 415a and 415e and a second sidewall 415b and 415f, while facing each other. At least one of the third sidewall and the fourth sidewall may have an identical or similar shape as the first sidewall 415*a* and 415*e* or the second sidewall 415*b* and 415*f*.

At least a portion of a fifth-type mold rib 515 of the upper mold 520, which corresponds to the fifth-type position adjusting groove 415, may have the structure for being seated in the fifth-type position adjusting groove 415. For example, the fifth-type mold rib 515 may include an end portion corresponding to the bottom surface 415*s*, side surfaces linking to the end portion and corresponding to titled surfaces (e.g., at least the first titled surface 415*a* and the second titled surface 415*b*) of the fifth-type position adjusting groove 415, and curved parts extending from end portions of the side surfaces, having a specific curvature, and having a convex shape. Accordingly, the inner stiffness of the support plate 311 may be maintained, and degradation in the performance of the antenna of the housing 310 may be mitigated.

Although the fifth-type position adjusting groove 415 described above with reference to FIG. 10 includes four sidewalls having the same structure by way of example, the disclosure is not limited thereto. For example, the third sidewall and the fourth sidewall may have shapes different from those of the first sidewall 415*a* and 415*e* and the second sidewalls 415*b* and 415*f*. For example, the third sidewall and the fourth sidewall may be formed perpendicularly from the edge of the bottom surface 415*s* in the z-axis direction toward the top surface of the support plate 311 from the edge of the bottom surface 415*s*, as illustrated in FIG. 6. Alternatively, the third sidewall and the fourth sidewall may constitute one titled surface having a tilt angle equal to or greater than 20° and less than 90° formed with respect to a line extending in the z-axis direction toward the top surface of the support plate 311 from the edge of the bottom surface 415*s*, as illustrated in FIG. 7.

As described above, various types of position adjusting grooves, which are formed in the boundary between the first lead 311_1 of the support plate 311 and the first lead injection molded member 312_1 of the injection molded member 312, have been described with reference to FIGS. 6 to 10, but the disclosure is not limited thereto. For example, the various types of the position adjusting grooves may be identically applied to various positions of the support plate 311, such as the boundary between at least one lead, in order to connect the first antenna unit 311*a* with the main body 311_21, and an adjacent injection molded part, the boundary between the boundary between at least one lead, in order to connect the second antenna unit 311*b* with the main body 311_21, and the adjacent injection molded part, and the boundary between at least one lead, in order to connect the third antenna unit 311*c* with the main body 311_21 and the adjacent injection molded part. Alternatively, although the shape of the position adjusting groove in the disclosure may be unified, as in the second-type position adjusting groove 412 described with reference to FIG. 7, various types of position adjusting groove may be applied depending on the position or the shape of the lead.

As described above, a housing of a portable electronic device may include an injection molded member at least partially uncovered (or exposed) to an outside, a support plate (bracket) positioned inside the injection molded member and at least partially serving as an antenna, and a communication circuit. The housing of the portable electronic device may be electrically connected with the communication circuit through an antenna grounding part. A groove to adjust a position by a mold may be formed at a peripheral portion of the antenna grounding part while crossing the support plate and the injection molded member. The side surface of the position adjusting groove may have a tilt angle of at least 20°.

According to an embodiment, a portable communication device may include a housing and a PCB seated in the housing and mounted with a communication circuit. The housing may include a support plate including at least one antenna unit operatively connected with the communication circuit, and an injection molded member to surround at least a portion of the at least one antenna unit. The support plate may include a main body in which at least a portion of the PCB is seated, and at least one lead to connect the at least one antenna unit with the main body. In addition, the support plate may include at least one position adjusting groove formed at a position at which the at least one lead makes contact with the injection molded member.

The at least one position adjusting groove includes a first part formed by engraving a portion of the support plate, and a second part formed by engraving a portion of the injection molded member and connected with the first part.

A bottom surface of the first part and a bottom surface of the second part are connected with each other to form one bottom surface. The bottom surface of the first part and the bottom surface of the second part are positioned on the same plane.

The at least one position adjusting groove includes, as a bottom of the first part and a bottom of the second part are connected with each other to form one bottom surface, a plurality of sidewalls having a tilt angle greater than 0° from a line extending from a top surface of the support plate toward the bottom surface.

The tilt angle is formed at 20° or more.

The plurality of sidewalls includes a first sidewall having a portion included in the first part and another portion included in the second part, and a second sidewall which has a portion included in the first part and another portion included in the second part, and is positioned in opposition to the first sidewall.

The plurality of sidewalls includes a third sidewall, which is interposed between the first sidewall and the second sidewall and includes a first material, and a fourth sidewall which is interposed between the first sidewall and the second sidewall, is provided in opposition to the third sidewall, and includes a second material.

The portable electronic device further includes a third sidewall, which is interposed between the first sidewall and the second sidewall, includes a first material, and is formed perpendicularly from one edge of the bottom surface, and a fourth sidewall which is interposed between the first sidewall and the second sidewall, is provided in opposition to the third sidewall, includes a second material, and is formed perpendicularly from an opposite edge of the bottom surface.

The plurality of sidewalls includes a first sidewall included in the first part and including a first material, and a second sidewall included in the second part, including a second material, and positioned in opposition to the first sidewall.

The portable electronic device further includes a third sidewall, which is interposed between the first sidewall and the second sidewall, includes a portion including the first material and another portion including the second material, and is formed perpendicularly from one edge of the bottom surface, and a fourth sidewall which is interposed between the first sidewall and the second sidewall, is provided in opposition to the third sidewall, includes a portion including the first material and another portion including the second material, and is formed perpendicularly from an opposite edge of the bottom surface.

The at least one position adjusting groove includes a curved surface engraved and having the shape of a semi-sphere.

The at least one position adjusting groove includes a first part, which corresponds to a portion of the curved surface, in which the portion of the curved surface includes a first material, and a second part which corresponds to another portion of the curved surface, in which the another portion of the curved surface includes a second material.

The at least one position adjusting groove has a stepped shape.

The at least one position adjusting groove includes a bottom surface, and a first sidewall and a second sidewall formed from an edge of the bottom surface toward a top surface of the support plate. The first sidewall has a first tilted surface, which is formed at a tilt angle greater than 0° with respect to a line extending from a first-side edge of the bottom surface toward the top surface of the support plate, and a first curved surface which is stepped at an upper end portion of the first tilted surface and formed toward the top surface of the support plate. The second sidewall includes a second titled surface, which is formed at a tilt angle greater than 0° with respect to a line extending toward the top surface of the support plate from a second-side edge provided in opposition to the first-side edge of the bottom surface, and a second curved surface which is stepped at an upper end portion of the second tilted surface, formed toward the top surface of the second tilted surface, and positioned in opposition to the first curved surface.

The position adjusting groove is disposed to be closer to the main body rather than the at least one antenna unit.

At least one lead may include a first lead positioned in a first direction between the main body and a first antenna unit, and a second lead extending positioned in a second direction between the main body and the first antenna unit.

The at least one position adjusting groove includes a first position adjusting groove having a portion formed in the first lead and a second position adjusting groove having a portion formed in the second lead.

According to an embodiment, a housing includes a support plate including at least one antenna unit operatively connected with the communication circuit, and an injection molded member to surround at least a portion of the at least one antenna unit. The support plate includes a main body, at least one lead to connect the at least one antenna unit with the main body, and at least one position adjusting groove formed at a position at which the at least one lead makes contact with the injection molded member.

The at least one position adjusting groove includes a first part formed by engraving a portion of the support plate, and a second part formed by engraving a portion the injection molded member and connected with the first part. The at least one position adjusting groove may include a structure including at least one sidewall having a tilt angle greater than 0°, a structure including a curved surface engaged and having the shape of a semi-sphere, and a structure stepped.

According to the support plate and the portable communication device including the same of various embodiments, the support plate may be prevented from being deformed or broken.

In addition, various objects and effects will be apparent from embodiments of the detailed description, according to the support plate and the portable communication device including the same of various embodiments.

Figure 11:
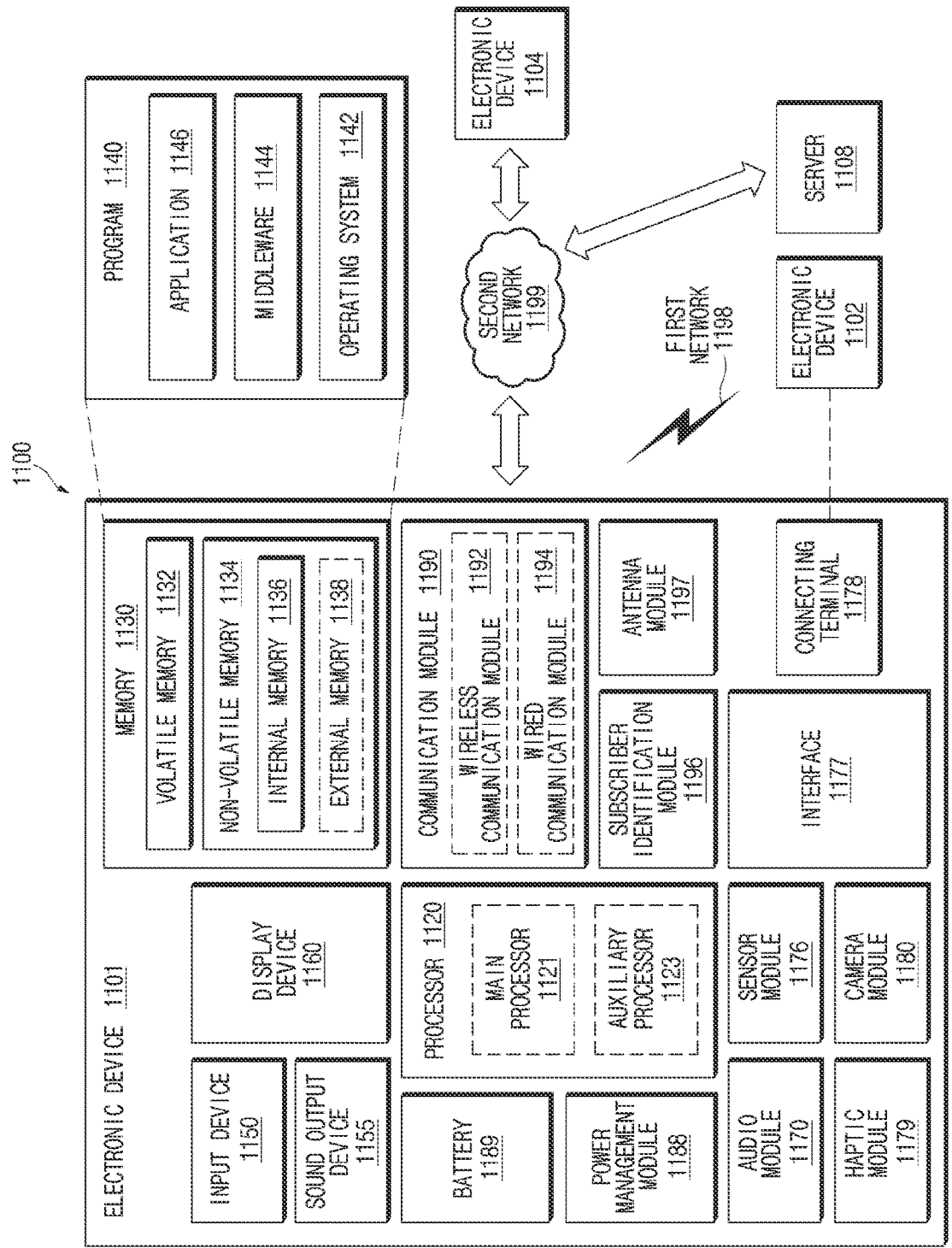
FIG. 11 is a block diagram illustrating an electronic device in a network environment according to an embodiment.

FIG. 11 is a block diagram illustrating an electronic device 1101 in a network environment 1100 according to an embodiment. Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). The electronic device 1101 may communicate with the electronic device 1104 via the server 1108. The electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) card 1196, or an antenna module 1197. At least one of the components may be omitted from the electronic device 1101, or one or more other components may be added in the electronic device 1101. Some of the components may be implemented as a single component.

The processor 1120 may execute a program 1140 to control at least one hardware or software component of the electronic device 1101 coupled with the processor 1120 and may perform various data processing or computation. As at least part of the data processing or computation, the processor 1120 may store a command or data received from the sensor module 1176 or the communication module 1190 in volatile memory 1132, process the command or the data stored in the volatile memory 1132, and store resulting data in non-volatile memory 1134. The processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component among the components of the electronic device 1101, instead of the main processor 1121 while the main processor 1121 is in an inactive (e.g., sleep) state, or together with the main processor 1121 while the main processor 1121 is in an active state. The auxiliary processor 1123 may be implemented as part of the camera module 1180 or the communication module 1190 functionally related to the auxiliary processor 1123. The auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server 1108. Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a. recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component of the electronic device 1101. The various data may include the program 1140 and input data or output data for a command related thereto. The memory 1130 may include the volatile memory 1132 or the non-volatile memory 1134.

The program 1140 may be stored in the memory 1130 as software and may include an operating system (OS) 1142, middleware 1144, or an application 1146.

The input module 1150 may receive a command or data to be used by the processor 1120 of the electronic device 1101, from a user of the electronic device 1101. The input module 1150 may include a microphone, a mouse, a keyboard, a key (e.g., a button), or a digital pen (e.g., a stylus pen).

The sound output module 1155 may output sound signals to the outside of the electronic device 1101. The sound output module 1155 may include a speaker or a receiver. The speaker may be used for general purposes, such as playing multimedia or playing record. The receiver may be used for receiving incoming calls. The receiver may be implemented as separate from, or as part of the speaker.

The display module 1160 may visually provide information to the user of the electronic device 1101. The display module 1160 may include a display, a hologram device, or a projector and control circuitry to control a corresponding one of the display, hologram device, and projector. The display module 1160 may include a touch sensor adapted to detect a touch, or a pressure sensor adapted to measure the intensity of force incurred by the touch.

The audio module 1170 may convert a sound into an electrical signal and vice versa. The audio module 1170 may obtain the sound via the input module 1150 or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. The sensor module 1176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. The interface 1177 may include a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). The connecting terminal 1178 may include a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. The haptic module 1179 may include a motor, a piezoelectric element, or an electric stimulator.

The camera module 1180 may capture a still image or moving images. The camera module 1180 may include one or more lenses, image sensors, image signal processors, or flashes.

The power management module 1188 may manage power supplied to the electronic device 1101. The power management module 1188 may be implemented as at least part of a power management integrated circuit (PMIC).

The battery 1189 may supply power to at least one component of the electronic device 1101. The battery 1189 may include a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. The communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large-scale antenna. The wireless communication module 1192 may support various requirements specified in the electronic device 1101, an external electronic device (e.g., the electronic device 1104), or a network system (e.g., the second network 1199). The wireless communication module 1192 may support a peak data rate 20 Gbps or more) for implementing eMBB, loss coverage (e.g., 1164 dB or less) for implementing mMTC, or U-plane latency (e.g., 0.5 ms or less for each of downlink (DL) and uplink (UL), or a round trip of 11 ms or less) for implementing URLLC.

The antenna module 1197 may transmit or receive a signal or power to or from the external electronic device of the electronic device 1101. The antenna module 1197 may include an antenna including a radiating element composed of a conductive material or a conductive pattern formed in or on a PCB. The antenna module 1197 may include array antennas. In such a case, at least one antenna appropriate for a communication scheme used in the communication network, such as the first network 1198 or the second network 1199, may be selected by the wireless communication module 1192 from the plurality of antennas. The signal or the power may then be transmitted or received between the communication module 1190 and the external electronic device via the selected at least one antenna. Another component (e.g., a radio frequency integrated circuit (RFIC)) other than the radiating element may be additionally formed as part of the antenna module 1197.

The antenna module 1197 may form a mmWave antenna module. The mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., may antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 1101 and the external electronic device 1104 via the server 1108 coupled with the second network 1199. Each of the electronic devices 1102 or 1104 may be of a same type as, or a different type, from the electronic device 1101. All or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example.

The electronic device 1101 may provide ultra low-latency services using, e.g., distributed computing or mobile edge computing. In another embodiment, the external electronic device 1104 may include an Internet-of-things (IoT) device. The server 1108 may be an intelligent server using machine learning and/or a neural network. The external electronic device 1104 or the server 1108 may be included in the second network 1199. The electronic device 1101 may be applied to intelligent services (e.g., smart home, smart city, smart car, or healthcare) based on 5G communication technology or IoT-related technology.

As used in connection with various embodiments of the disclosure, the term "module" may include a unit implemented in hardware, software, or firmware, and may interchangeably be used with other terms such as "logic," "logic block," "part," or "circuitry". A module may be a single integral component, or a minimum unit or part thereof, adapted to perform one or more functions. For example, the module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This enables the machine to be operated to perform at least one function according to the at least one instruction invoked. The one or more instructions may include a code generated by a complier or a code executable by an interpreter. The machine-readable storage medium may be provided in the form of a non-transitory storage medium, which indicates that the storage medium is a tangible device and does not include a signal. However, this term does not differentiate between where data is semi-permanently stored in the storage medium and where the data is temporarily stored in the storage medium.

A method according to embodiments may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

While the present disclosure has been described with reference to various embodiments, various changes may be made without departing from the spirit and the scope of the present disclosure, which is defined, not by the detailed description and embodiments, but by the appended claims and their equivalents.

What is claimed is:

1. A portable communication device comprising:
    a housing;
    a printed circuit board seated in the housing and mounted to a communication circuit; and
    at least one groove positioned in the housing,
    wherein the housing includes a support plate having at least one antenna unit operatively connected with the communication circuit, and an injection molded member surrounding at least a portion of the at least one antenna unit,
    wherein the support plate includes a main body in which at least a portion of the printed circuit board is seated, and at least one lead connecting the at least one antenna unit with the main body,
    wherein the at least one groove is formed at a position at which the at least one lead makes contact with the injection molded member and includes a first part formed by a portion of the support plate, and a second part formed by a portion the injection molded member and being connected with the first part, and
    wherein the at least one groove is configured to be used in correcting a position of the support plate by preventing a lateral movement of the support plate from an injection pressure in the housing.

2. The portable communication device of claim 1,
    wherein a bottom surface of the first part and a bottom surface of the second part are connected with each other and form one bottom surface, and
    wherein the bottom surface of the first part and the bottom surface of the second part are positioned on a same plane.

3. The portable communication device of claim 1, wherein the at least one groove includes,
    a bottom of the first part and a bottom of the second part being connected with each other and forming one bottom surface, and
    a plurality of sidewalls having a tilt angle greater than zero degrees based on a line extending from a top surface of the support plate toward the bottom surface.

4. The portable communication device of claim 3,
    wherein the tilt angle is at least twenty degrees.

5. The portable communication device of claim 3, wherein the plurality of sidewalls includes:
    a first sidewall having a portion included in the first part and another portion included in the second part; and
    a second sidewall having a portion included in the first part and another portion included in the second part, and being positioned in opposition to the first sidewall.

6. The portable communication device of claim 5, wherein the plurality of sidewalls further includes:

a third sidewall, which is interposed between the first sidewall and the second sidewall and includes a first material; and
    a fourth sidewall which is interposed between the first sidewall and the second sidewall, is provided in opposition to the third sidewall, and includes a second material.

7. The portable communication device of claim 5, further comprising:
    a third sidewall interposed between the first sidewall and the second sidewall, the third sidewall including a first material and being perpendicularly formed from one edge of the bottom surface; and
    a fourth sidewall which is interposed between the first sidewall and the second sidewall, the fourth sidewall being provided in opposition to the third sidewall, including a second material, and being formed perpendicularly from an opposite edge of the bottom surface.

8. The portable communication device of claim 3, wherein the plurality of sidewalls includes:
    a first sidewall included in the first part and including a first material; and
    a second sidewall included in the second part, the second sidewall including a second material and being positioned in opposition to the first sidewall.

9. The portable communication device of claim 8, further comprising:
    a third sidewall, which is interposed between the first sidewall and the second sidewall, the third sidewall including a portion including the first material and another portion including the second material, and being formed perpendicularly from one edge of the bottom surface; and
    a fourth sidewall which is interposed between the first sidewall and the second sidewall, the fourth sidewall being provided in opposition to the third sidewall, including a portion including the first material and another portion including the second material, and being formed perpendicularly from an opposite edge of the bottom surface.

10. The portable communication device of claim 1, wherein the at least one groove includes:
    a curved surface engraved and having a semi-spherical shape.

11. The portable communication device of claim 10, wherein the at least one groove includes:
    a first part, which corresponds to a portion of the curved surface, wherein the portion of the curved surface includes a first material; and
    a second part which corresponds to another portion of the curved surface, wherein the another portion of the curved surface includes a second material.

12. The portable communication device of claim 1,
    wherein the at least one groove includes a stepped form.

13. The portable communication device of claim 12, wherein the at least one groove includes:
    a bottom surface; and
    a first sidewall and a second sidewall formed toward a top surface of the support plate from an edge of the bottom surface,
    wherein the first sidewall includes:
    a first tilted surface, which is formed at a tilt angle greater than zero degrees with respect to a line extending from a first-side edge of the bottom surface toward the top surface of the support plate, and a first curved surface which is stepped at an upper end portion of the first tilted surface and formed toward the top surface of the support plate, and wherein the second sidewall includes:
a second titled surface, which is formed at a tilt angle greater than zero degrees with respect to a line extending toward the top surface of the support plate from a second-side edge which is provided in opposition to the first-side edge of the bottom surface, and a second curved surface which is stepped at an upper end portion of the second tilted surface, the second curved surface being formed toward the top surface of the second tilted surface and being positioned in opposition to the first curved surface.

14. The portable communication device of claim 1, wherein the groove is disposed to be closer to the main body rather than the at least one antenna unit.

15. The portable communication device of claim 1, wherein the at least one lead includes:
a first lead positioned in a first direction between the main body and the first antenna unit; and
a second lead extending positioned in a second direction between the main body and the first antenna unit.

16. The portable communication device of claim 15, wherein the at least one groove includes:
a first groove having a portion formed in the first lead; and
a second groove having a portion formed in the second lead.

17. A housing comprising:
a support plate including at least one antenna unit operatively connected with a communication circuit, and
an injection molded member to surround at least a portion of the at least one antenna unit;
wherein the support plate includes:
a main body,
at least one lead to connect the at least one antenna unit with the main body, and at least one groove formed at a position at which the at least one lead makes contact with the injection molded member and including a first part formed by a portion of the support plate, and a second part formed by a portion of the injection molded member and being connected with the first part, and
wherein the at least one groove is configured to be used in correcting a position of the support plate by preventing a lateral movement of the support plate from an injection pressure in the housing.

18. The housing of claim 17, wherein the at least one groove includes at least one of:
a structure including at least one sidewall having a tilt angle greater than 0°,
a structure including a curved surface engaged and having the shape of a semi-sphere, or
a structure stepped.

* * * * *